(12) United States Patent
Mizukami

(10) Patent No.: US 10,596,581 B2
(45) Date of Patent: Mar. 24, 2020

(54) ACTUATOR, LIQUID DISCHARGE HEAD, LIQUID DISCHARGE DEVICE, AND LIQUID DISCHARGE APPARATUS

(71) Applicant: Satoshi Mizukami, Kanagawa (JP)

(72) Inventor: Satoshi Mizukami, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 16/240,881

(22) Filed: Jan. 7, 2019

(65) Prior Publication Data

US 2019/0275545 A1    Sep. 12, 2019

(30) Foreign Application Priority Data

Mar. 9, 2018 (JP) .................. 2018-042826
Oct. 26, 2018 (JP) .................. 2018-201851

(51) Int. Cl.
*B05B 11/04* (2006.01)
*H01L 41/09* (2006.01)
(Continued)

(52) U.S. Cl.
CPC .......... *B05B 11/048* (2013.01); *B05B 12/088* (2013.01); *B41J 2/14233* (2013.01); *B41J 2/1607* (2013.01); *B81B 3/0021* (2013.01); *B81B 3/0037* (2013.01); *B81C 1/00365* (2013.01); *H01L 27/20* (2013.01); *H01L 41/0478* (2013.01); *H01L 41/0533* (2013.01); *H01L 41/0815* (2013.01); *H01L 41/0973* (2013.01); *H01L 41/1876* (2013.01);
(Continued)

(58) Field of Classification Search
CPC .......... B41J 2/04581; B41J 2/04573; B41J 2/14233; B41J 2/1628; B41J 2/1642; B41J 2/1645; B41J 2/161; B41J 2/1607; H01L 41/0973
USPC ................................. 347/68, 70–72
See application file for complete search history.

(56) References Cited

U.S. PATENT DOCUMENTS 9,597,872 B2 *   3/2017   Mizukami ............ B41J 2/14233
2007/0195134 A1 *  8/2007   Lee ...................... B41J 2/14233
                                                            347/72
(Continued)

FOREIGN PATENT DOCUMENTS

JP    2004-034417    2/2004
JP    2005-176433    6/2005
(Continued)

OTHER PUBLICATIONS

U.S. Appl. No. 16/015,613 filed Jun. 22, 2018, Satoshi Mizukami, et al.

*Primary Examiner* — An H Do
(74) *Attorney, Agent, or Firm* — Oblon, McClelland, Maier & Neustadt, L.L.P.

(57) ABSTRACT

An actuator includes a diaphragm, a lower electrode on the diaphragm, an electromechanical transducer film on the lower electrode, and an upper electrode on the electromechanical transducer film. The diaphragm includes a first silicon oxide film having a thickness of 0.5 μm or more, a silicon layer on the first silicon oxide film, a thickness of which is 3 μm or more, and a second silicon oxide film on the silicon layer, a thickness of which is 0.5 μm or more. A volume resistivity of the silicon layer is $10^3$ Ω·cm or more and $10^6$ Ω·cm or less.

16 Claims, 12 Drawing Sheets

(51) Int. Cl.
- *B41J 2/16* (2006.01)
- *B05B 12/08* (2006.01)
- *H01L 41/187* (2006.01)
- *H01L 27/20* (2006.01)
- *H01L 41/053* (2006.01)
- *H01L 41/08* (2006.01)
- *H01L 41/047* (2006.01)
- *B41J 2/14* (2006.01)
- *B81B 3/00* (2006.01)
- *B81C 1/00* (2006.01)
- *H01L 41/257* (2013.01)
- *H01L 41/23* (2013.01)

(52) U.S. Cl.
CPC .. *B41J 2002/14258* (2013.01); *B41J 2202/03* (2013.01); *B81C 1/00666* (2013.01); *B81C 2201/0164* (2013.01); *B81C 2201/0167* (2013.01); *H01L 41/0471* (2013.01); *H01L 41/0472* (2013.01); *H01L 41/23* (2013.01); *H01L 41/257* (2013.01)

(56) References Cited

U.S. PATENT DOCUMENTS

| | | |
|---|---|---|
| 2015/0349240 A1 | 12/2015 | Mizukami |
| 2016/0099402 A1 | 4/2016 | Mizukami et al. |
| 2016/0167383 A1 | 6/2016 | Mizukami |
| 2016/0236470 A1 | 8/2016 | Mizukami |
| 2016/0263892 A1 | 9/2016 | Mizukami |
| 2016/0263893 A1 | 9/2016 | Mizukami et al. |
| 2016/0351788 A1 | 12/2016 | Mizukami |
| 2017/0173955 A1 | 6/2017 | Mizukami |
| 2017/0291419 A1 | 10/2017 | Mizukami |
| 2017/0334205 A1 | 11/2017 | Mizukami |
| 2018/0264809 A1 | 9/2018 | Mizukami |

FOREIGN PATENT DOCUMENTS

| | | |
|---|---|---|
| JP | 2007-281031 | 10/2007 |
| JP | 2008-228458 | 9/2008 |
| JP | 2009-272642 | 11/2009 |
| JP | 2012-158011 | 8/2012 |
| JP | 2017-205955 | 11/2017 |

* cited by examiner

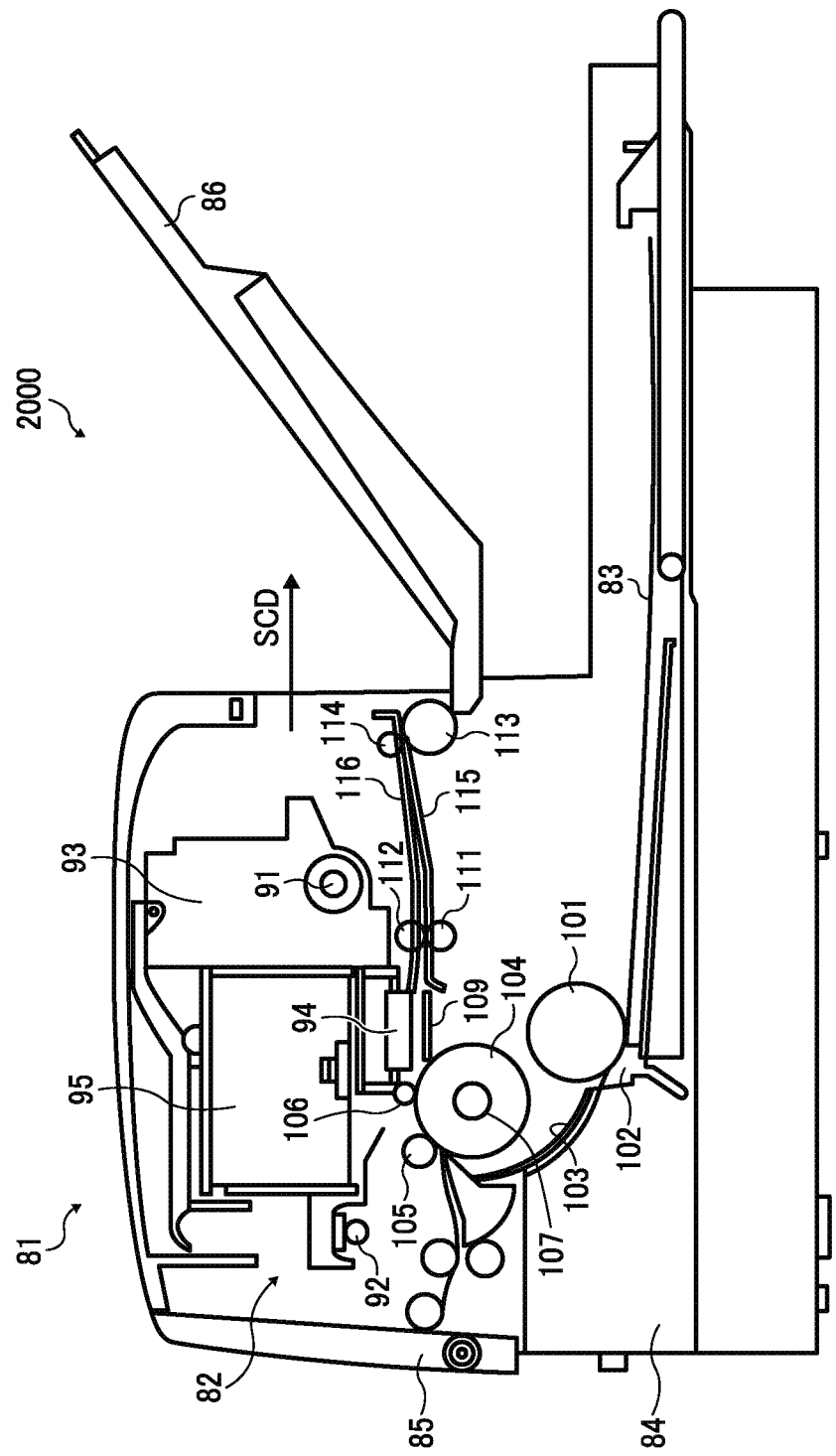

ACTUATOR, LIQUID DISCHARGE HEAD, LIQUID DISCHARGE DEVICE, AND LIQUID DISCHARGE APPARATUS

CROSS-REFERENCE TO RELATED APPLICATIONS

This patent application is based on and claims priority pursuant to 35 U.S.C. § 119(a) to Japanese Patent Application No. 2018-042826, filed on Mar. 9, 2018, and Japanese Patent Application No. 2018-201851, filed on Oct. 26, 2018, in the Japan Patent Office, the entire disclosure of each of which is hereby incorporated by reference herein.

BACKGROUND

Technical Field

The present disclosure relates to an actuator, a liquid discharge head, a liquid discharge device, and a liquid discharge apparatus.

Related Art

In industrial and commercial printing, high-performance liquid discharge heads and liquid discharge apparatuses that can be driven at high frequency (high-frequency driving) are in high demand.

Specific examples of such a liquid discharge head and liquid discharge apparatus include a nozzle for discharging a liquid, a pressure chamber communicating with the nozzle, a diaphragm forming a part of the pressure chamber, and an electromechanical transducer such as a piezoelectric element for applying pressure to the ink in the pressure chamber.

The pressure chamber is also referred to as an individual chamber. The liquid discharge head using the electromechanical transducer discharges a liquid from the nozzle by applying pressure to the liquid in the pressure chamber with the electromechanical transducer.

As one method to achieve high-frequency driving, it is important to increase the stiffness of the diaphragm, that is, a thickness of the diaphragm is increased to increase rigidity. Further, there is a technique of using a silicon-on-insulator (SOI) wafer as the material of the diaphragm.

However, increasing the thickness of the diaphragm in an effort to increase rigidity decreases an amount of deformation of the diaphragm when a force is applied to the diaphragm, thus degrading discharge efficiency of the liquid discharge head.

SUMMARY

In an aspect of this disclosure, a novel actuator is provided that includes a diaphragm, a lower electrode on the diaphragm, an electromechanical transducer film on the lower electrode, and an upper electrode on the electromechanical transducer film. The diaphragm includes a first silicon oxide film having a thickness of 0.5 µm or more, a silicon layer on the first silicon oxide film, a thickness of which is 3 µm or more, and a second silicon oxide film on the silicon layer, a thickness of which is 0.5 µm or more. Volume resistivity of the silicon layer is $10^3$ Ω·cm or more and $10^6$ Ω·cm or less.

BRIEF DESCRIPTION OF THE DRAWINGS

The aforementioned and other aspects, features, and advantages of the present disclosure will be better understood by reference to the following detailed description when considered in connection with the accompanying drawings, wherein:

FIG. 22 is a side view of another example of the liquid discharge apparatus according to embodiments.

Figure 1:
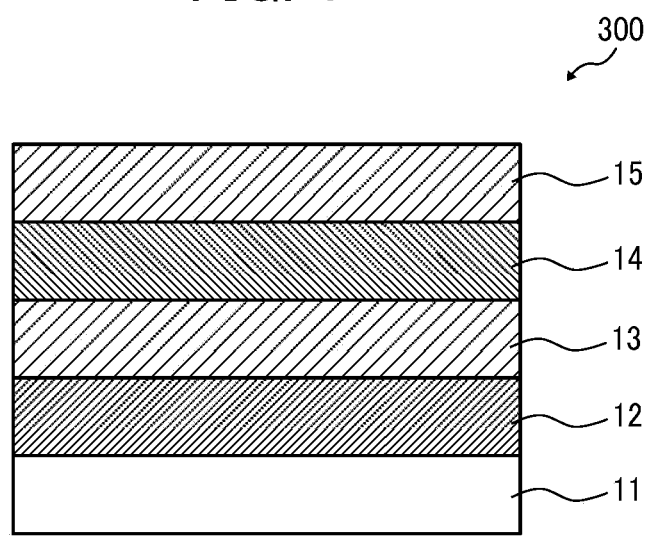
FIG. 1 is a cross-sectional view of an example of an actuator according to embodiments.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that have the same function, operate in an analogous manner, and achieve similar results.

Although the embodiments are described with technical limitations with reference to the attached drawings, such description is not intended to limit the scope of the disclosure and all the components or elements described in the embodiments of this disclosure are not necessarily indispensable. As used herein, the singular forms "a", "an", and "the" are intended to include the plural forms as well, unless the context clearly indicates otherwise.

Hereinafter, an actuator, a liquid discharge head, a liquid discharge device, and a liquid discharge apparatus according to a present embodiment is described with reference to the drawings. The present disclosure may be modified within a range that can be conceived by those skilled in the art. The modification includes such as substitution to other embodiments, additions, modifications, or deletions. The modified present disclosure is included in the scope of the present disclosure as long as the functions and effects of the present disclosure are exhibited.

The present disclosure can be applied to printing fields such as digital printing field. As a machinery for the digital printing fields, there is a digital printing apparatus using inkjet printer and Multifunction peripheral (MFP). Further, the present disclosure may be applied to the printer and the MFP used in office or personal. Further, the present disclosure may be applied to three-dimensional fabrication technology using inkjet technology and the like.

[Actuator and Liquid Discharge Head]

The actuator 300 of the present embodiment includes a diaphragm 12, a lower electrode 13, an electromechanical transducer film 14 and an upper electrode 15. The diaphragm 12 includes a first silicon oxide film having a thickness of 0.5 μm or more, a silicon layer 21 having a thickness of 3 μm or more on the first silicon oxide film 20, and a second silicon oxide film 22 having a thickness of 0.5 μm or more on the silicon layer 21. The silicon layer 21 has a volume resistivity of $10^3$ Ω·cm or more and $10^6$ Ω·cm or less.

First Embodiment

Hereinafter, an embodiment of the actuator 300 according to the present embodiment is described. FIG. 1 is a cross-sectional view of the actuator 300 of the present embodiment. FIG. 1 illustrates a substrate 11, a diaphragm 12, a lower electrode 13, an electromechanical transducer film 14, and an upper electrode 15. In the present embodiment, the lower electrode 13, the electromechanical transducer film 14, the upper electrode 15, for example, are formed on the substrate 11 one by one by etching or the like.

A detailed description is now given of each of the elements of the substrate 11, the diaphragm 12, the lower electrode 13, the electromechanical transducer film 14, and the upper electrode 15. Here, the details of the substrate 11, the diaphragm 12, the lower electrode 13, and the upper electrode 15 are mainly described. A description of the electromechanical transducer film 14 and other configurations is deferred.

[Substrate]

A silicon single crystal substrate is preferably used as the substrate 11. The substrate 11 preferably has a thickness of 100 to 600 μm. As plane orientations, there are three types of (100), (110), and (111) plane orientations. The (100) and (111) plane orientations are widely used in semiconductor industry in general. The single crystal substrate having the (100) plane orientation can be mainly used for a liquid discharge head 500 (see FIGS. 6 and 7). The "liquid discharge head" is simply referred to as a "head".

[Lower Electrode and Upper Electrode]

Platinum as a metal material having high heat resistance and low reactivity can be used for the lower electrode 13 and the upper electrode 15. However, platinum may not be a sufficient barrier against lead. Thus, platinum group elements such as iridium and platinum-rhodium or alloy films of the platinum group elements may be used.

When platinum is used as the lower electrode 13 and the upper electrode 15, the lower electrode 13 and the upper electrode 15 are preferably laminated on the diaphragm 12 via an adhesion layer of Ti, $TiO_2$, Ta, $Ta_2O_5$, and $Ta_3N_5$, for example, in consideration of the adhesiveness between the lower electrode 13 and the diaphragm 12 (particularly $SiO_2$) as a base. Examples of a method of producing the lower electrode 13 and the upper electrode 15 include sputtering and vacuum vapor deposition. The film thickness of the lower electrode 13 and the upper electrode 15 is preferably 0.05 to 1 μm and is more preferably 0.1 to 0.5 μm.

Further, an oxide electrode film made of $SrRuO_3$ or $LaNiO_3$ may be formed between the metal material and the electromechanical transducer film 14 in the lower electrode 13 and the upper electrode 15. The oxide electrode film formed between the lower electrode 13 and the electromechanical transducer film 14 also affects an orientation of the electromechanical transducer film 14 (lead zirconate titanate (PZT) film, for example) manufactured on the lower electrode 13. Thus, different material is selected according to a direction of preferential orientation.

[Diaphragm]

Figure 2:
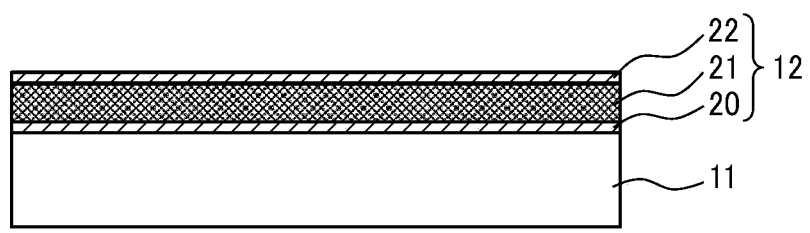
FIG. 2 is another cross-sectional view of the example of the actuator according to embodiments.

The diaphragm 12 of the present embodiment is made of Silicon On Insulator (SOI). FIG. 2 illustrates the diaphragm 12 of the present embodiment and is a cross-sectional view of the diaphragm 12 in FIG. 1 in detail. FIG. 2 illustrates the substrate 11, the first silicon oxide film 20, the silicon layer 21, and the second silicon oxide film 22 from bottom to top. The portions from the first silicon oxide film 20 to the second silicon oxide film 22 function as the diaphragm 12.

To drive the actuator 300 at a high frequency, a thickness of the diaphragm 12 is preferably as thick and as rigid as possible. However, if the thickness and the rigidity of the diaphragm are increased, an amount of deformation (displacement) when a force is applied to the actuator 300 is reduced. Thus, a discharge efficiency of the head 500 may be deteriorated.

Controlling the stress in the entire diaphragm 12 to the compression side can reduce a tensile stress on the electromechanical transducer film 14, increase a strain (amount of displacement), and improve the discharge efficiency while securing the rigidity of the diaphragm 12.

Figure 3:
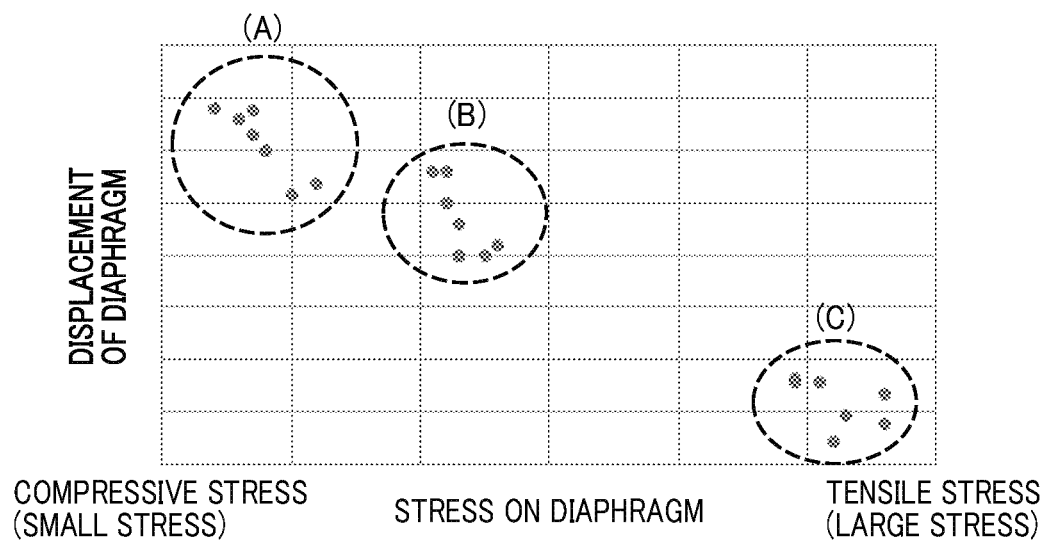
FIG. 3 is a graph plotting an example of a relation between stress on and displacement of a diaphragm.

The relation between stress and displacement of the diaphragm is described with reference to FIG. 3. FIG. 3 illustrates the stress on the diaphragm 12 in a horizontal axis and the amount of displacement of the diaphragm 12 in a vertical axis for a plurality of samples. The rigidity of the diaphragm 12 of the plurality of samples are equalized, and the stresses applied on the diaphragm 12 are varied toward compression side (left side in FIG. 3) and tension side (right side in FIG. 3) for the plurality of samples. As illustrated in (C) in FIG. 3, if the stress on the diaphragm 12 is on the tension side as illustrated in (C), the amount of displacement decreases. Conversely, as illustrated in (B) in FIG. 3, if the stress on the diaphragm 12 is on the compression side, the amount of displacement increases to be greater than the amount of displacement in (C). Further, as illustrated in (A) in FIG. 3, if the stress on the diaphragm 12 is on the compression side and is within a predetermined range (left end in FIG. 3), the amount of displacement further increases to be greater than the amount of displacement in (B). The present embodiment aims to obtain the amount of displacement of (A) in FIG. 3 and thus can improve the discharge efficiency of the head 500 while securing the rigidity of the diaphragm 12.

The present embodiment uses a Silicon On Insulator (SOI) wafer as a material of the diaphragm 12 to increase the rigidity of the diaphragm 12. Each of the first silicon oxide film 20, the silicon layer 21, and the second silicon oxide film 22 is made to have predetermined thicknesses, and the stress on the silicon layer 21 is lowered to become the compressive stress. Thus, the present embodiment can shift the stress on the entire diaphragm 12 to the compression side, reduce the tensile stress on the electromechanical transducer film 14, increase the amount of displacement of the diaphragm 12, and improve the discharge efficiency of the head 500. Further, it is important to set the resistance value of the silicon layer 21 in the diaphragm 12 to a predetermined value to shift the stress on the entire diaphragm 12 to the compression side.

A detailed description is now given of each of the elements of the substrate 11, the diaphragm 12, the lower electrode 13, the electromechanical transducer film 14, and the upper electrode 15.

[First Silicon Oxide Film]

The first silicon oxide film 20 is also referred to as a "box layer" and functions as a buried oxide film. The first silicon oxide film 20 preferably has compressive stress. The thickness of the first silicon oxide film 20 is 0.5 μm or more and more preferably 1 μm or more. The thickness of the first silicon oxide film 20 of 0.5 μm or more can shift the stress on entire diaphragm 12 to the compression side. Further, the thickness of the first silicon oxide film 20 is preferably 8 μm or less.

[Second Silicon Oxide Film]

The second silicon oxide film 22 is also referred to as a "surface layer" and is an oxide film obtained by oxidizing the silicon layer 21. The second silicon oxide film 22 preferably has a compressive stress. The thickness of the second silicon oxide film 22 is 0.5 μm or more and more preferably 2 μm or more. The thickness of the first silicon oxide film 20 of 0.5 μm or more can shift the stress on entire diaphragm 12 to the compression side. Further, the thickness of the second silicon oxide film 22 is preferably 8 μm or less.

The second silicon oxide film 22 functions to prepare a crystal film having a very high degree of (100) orientation when the lower electrode 13 and the electromechanical transducer film 14 as a PZT film are formed on the second silicon oxide film 22. The actuator 300 including the second silicon oxide film 22 having thickness of 0.5 μm or more can easily obtain the crystal film having a high degree of (100) orientation of the lower electrode 13 and PZT film (electromechanical transducer film 14).

Further, the thickness of the second silicon oxide film 22 is preferably equal to or greater than the thickness of the first silicon oxide film 20. Thus, the present embodiment can easily shift the stress on the entire diaphragm 12 to the compression side and further increase the rigidity of the diaphragm 12.

[Silicon Layer]

The silicon layer 21 is also referred to as an active layer and has a thickness of 3 μm or more. The silicon layer 21 having the thickness of 3 μm or more can increase the rigidity of the diaphragm 12. The thickness of the silicon layer 21 is preferably 5 μm or more to improve the discharge characteristics of the head 500. Further, the thickness of the silicon layer 21 is preferably 12 μm or less and more preferably 8 μm or less.

Reduction of the stress on the silicon layer 21 to a predetermined range can shift the stress on the entire diaphragm to compression side. To lower the stress on the silicon layer 21, it is important to set the resistance of the silicon layer 21 to a predetermined value.

Figure 4:
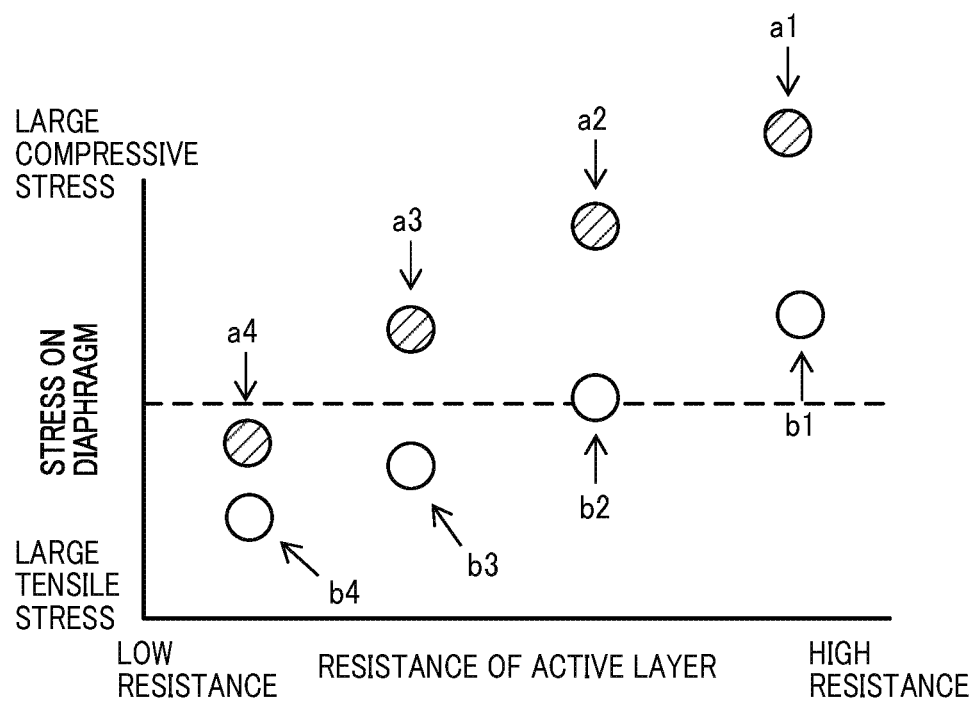
FIG. 4 is a graph plotting an example of the relation between resistance of a silicon layer (active layer), the stress on the diaphragm, and the thickness of the second silicon oxide film (surface layer).

FIG. 4 is a graph illustrating a relation between the resistance value of the silicon layer 21 and the stress on the diaphragm 12. In FIG. 4, a horizontal axis represents the resistance value of the silicon layer 21, and a vertical axis represents the stress on the diaphragm 12. Results of measurement of the resistance values and the stresses of the diaphragms 12 of several samples are plotted in FIG. 4. The upper side of the vertical axis is the compressive stress side and the lower side is the tensile stress side. A small stress value locates in an upper side in the vertical axis because the stress is in the compression side. A large stress value locates in a lower side in the vertical axis because the stress is in the tensile side.

In FIG. 4, a1 to a4 are samples in which the second silicon oxide film 22 (surface layer) is thick (about 2 μm). Conversely, b1 to b4 are samples in which the second silicon oxide film 22 (surface layer) is thin (about 0.3 μm). In the samples a1 to a4 and b1 to b4 in FIG. 4, the rigidity of the diaphragms 12 are identical.

Comparing a1 to a4 with b1 to b4, increasing the thickness of the second silicon oxide film 22 shifts the stress on the diaphragm 12 to the compression side. Comparing a1 to a4 or b1 to b4, increasing the resistance value of the silicon layer 21 decreases the stress on the silicon layer 21 that shifts the stress on the silicon layer 21 to the compression side. Thus, increasing the resistance value of the silicon layer 21 increases the stress on the diaphragm 12 on the compression side.

Thus, increasing the thickness of the second silicon oxide film 22 (surface layer) and increasing the resistance value of the silicon layer 21 to the high resistance side (right side in FIG. 4) can reduce the stress on the silicon layer 21 and adjust the stress on the entire diaphragm 12 to the compression side. Thus, the present embodiment adjusts the stress on the entire diaphragm 12 to the compression side to increase the amount of displacement of the diaphragm 12. Thus, the present embodiment adjusts the stress on the diaphragm 12 and the resistance value of the silicon layer 21 to aim (obtain) the diaphragm 12 as illustrated in the sample a1 in FIG. 4. In obtaining the plot of FIG. 4, the stress on the diaphragm 12 is determined to be compressive from the amount of deflection of the wafer of the diaphragm 12.

Although silicon (Si) has a slight tensile stress, the silicon oxide film has compressive stress. Therefore, the present embodiment increases the resistance value of the silicon layer 21 to lower the stress on the diaphragm 12. Further, making the thickness of the first silicon oxide film 20 (box layer) and the second silicon oxide film 22 to be thicker than a predetermined thickness can shift the stress on the entire diaphragm 12 to the compression side.

The volume resistivity of the silicon layer 21 is required to be $10^3$ Ω·cm or more and $10^6$ Ω·cm or less. The volume resistivity of the silicon layer 21 of $10^3$ Ω·cm or more decreases the stress on the silicon layer 21 to make the stress on the diaphragm 12 on the compression side. Thus, the present embodiment can shift the stress on the entire diaphragm 12 on the compression side. If the volume resistivity of the silicon layer 21 is less than $10^3$ Ω·cm, satisfactory piezoelectric characteristics of the actuator 300 and the discharge characteristics of the head 500 may not be obtained. If the volume resistivity of the silicon layer 21 is greater than $10^6$ Ω·cm, polarization of the electromechanical transducer film 14 does not proceed well when polarization process is performed on the electromechanical transducer film 14. Thus, the discharge characteristic of the head 500 may deteriorate during a durability test by continuous driving of the head 500 performed after the polarization of the electromechanical transducer film 14. Further, the volume resistivity of the silicon layer 21 is preferably $10^4$ Ω·cm or more. The volume resistivity of the silicon layer 21 is measured using a resistivity meter such as a four-terminal method.

As a method of setting the volume resistivity of the silicon layer 21 within the above range ($10^3$ Ω·cm or more and $10^6$ Ω·cm or less), it is effective to control the concentration of additive (impurity) in the silicon layer 21 to an appropriate range. The concentration of impurities in the silicon layer 21 is consequently proportional to the volume resistivity of the silicon layer 21. Thus, controlling the concentration of impurities within an appropriate range can shift the stress on the diaphragm 12 and increase the rigidity of the diaphragm 12.

The silicon layer 21 may be, for example, p-type silicon or n-type silicon. If the silicon layer 21 is made of the p-type silicon, boron (B) is doped as an impurity, for example. In the case of p-type silicon, the concentration of impurities is preferably $1.3 \times 10^{13}$ atoms/cm$^3$ or less and is more preferably $1.3 \times 10^{12}$ atoms/cm$^3$ or less. The resistance value of the silicon layer 21 also affects the concentration of impurities. Thus, when the concentration of impurities satisfies the above preferable range ($1.3 \times 10^{13}$ atoms/cm$^3$ or less), the volume resistivity of the silicon layer 21 can be easily set within the above range ($10^3$ Ω·cm or more and $10^6$ Ω·cm or less).

Further, the lower limit value of the concentration of impurities is preferably $1.3 \times 10^{10}$ atoms/cm$^3$ or more. Then, the polarization process can be satisfactory performed on the electromechanical transducer film 14. Thus, the present embodiment can prevent deterioration of the discharge characteristic of the head 500 during the durability test by continuous driving of the head 500.

If the silicon layer 21 is made of the n-type silicon, arsenic (As), phosphorus (P), for example, is doped as an impurity. In the case of n-type silicon, the concentration of impurities is preferably $4.3 \times 10^{12}$ atoms/cm$^3$ or less and is more preferably $4.3 \times 10^{11}$ atoms/cm$^3$ or less. The resistance value of the silicon layer 21 also affects the concentration of impurities. Thus, when the concentration of impurities satisfies the above preferable range ($4.3 \times 10^{12}$ atoms/cm$^3$ or less), the volume resistivity of the silicon layer 21 can be easily set within the above range ($10^3$ Ω·cm or more and $10^6$ Ω·cm or less).

Further, the lower limit value of the concentration of impurities is preferably $4.3 \times 10^9$ atoms/cm$^3$ or more. Then, the polarization process can be satisfactory performed on the electromechanical transducer film 14. Thus, the present embodiment can prevent deterioration of the discharge characteristic of the head 500 during the durability test by continuous driving of the head 500.

A concentration of impurities can be measured by Inductively Coupled Plasma-Mass Spectrometry (ICP-MS) analysis or Secondary Ion Mass Spectrometry (SIMS) analysis.

[Flexural Rigidity]

In the present embodiment, the flexural rigidity of the diaphragm 12 is preferably $7.0 \times 10^{-10}$ Nm$^2$ or more and is more preferably $5.0 \times 10^{-9}$ Nm$^2$ or more. When the flexural rigidity satisfies the above described range, the head 500 can be satisfactorily driven and discharge the liquid at high frequency. In the present embodiment, the flexural rigidity of the diaphragm 12 is obtained from the film thickness, Young's modulus, and Poisson's ratio of each layer of the diaphragm 12.

[Thickness of Diaphragm]

The thickness of the diaphragm 12 is preferably 8 μm or more and is more preferably 10 μm or more. Making the thickness of the diaphragm 12 to be 8 μm or more can improve the discharge characteristics of the head 500. The thickness of the diaphragm 12 is preferably 20 μm or less.

Second Embodiment

Figure 5:
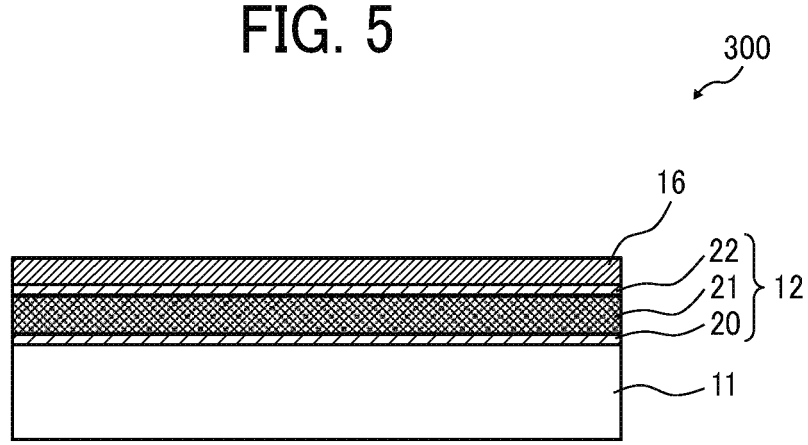
FIG. 5 is a cross-sectional view of another example of the actuator according to embodiments.

Another embodiment of the actuator 300 according to the present disclosure is described with reference to FIG. 5. A description of elements similar to the elements illustrated in FIG. 1 is omitted. FIG. 5 is a cross-sectional view of the actuator 300 similar to FIG. 1. In the present embodiment, a stress control layer 16 is formed between the diaphragm 12 and the lower electrode 13. That is, the stress control layer 16 is formed on the SOI diaphragm. The stress control layer 16 is made of a material having compressive stress. Providing the stress control layer 16 on the diaphragm 12 can shift the stress on the diaphragm 12 to the compression side when layers from the first silicon oxide film 20 to the stress control layer 16 are considered as the diaphragm 12 as a whole.

The material of the stress control layer 16 is not particularly limited as long as it has compressive stress. For example, oxide electrodes such as $ZrO_2$, $SiO_2$, poly-Si, and $LaNiO_3$ may be used as the material of the stress control layer 16. Among the oxide electrodes of $ZrO_2$, $SiO_2$, poly-Si, and $LaNiO_3$, $ZrO_2$ is preferable.

The film thickness is preferably 50 nm or more and is more preferably 100 nm or more. Setting the film thickness to be 50 nm or more can easily shift the stress on the entire diaphragm 12.

Third Embodiment

Figure 6:
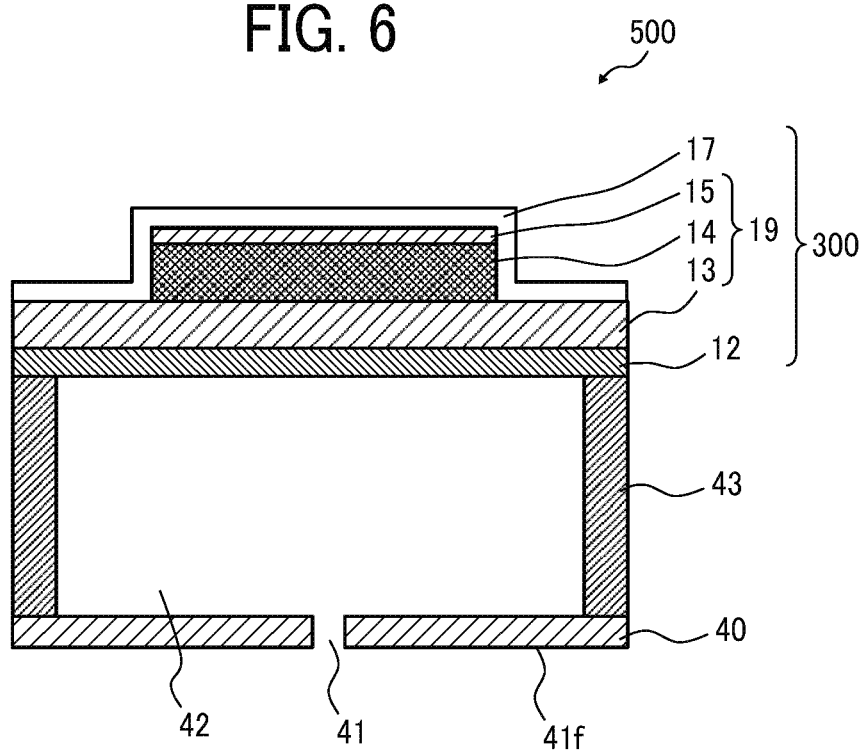
FIG. 6 is a cross-sectional view of an example of a liquid discharge head including the actuator according to embodiments.
Figure 7:
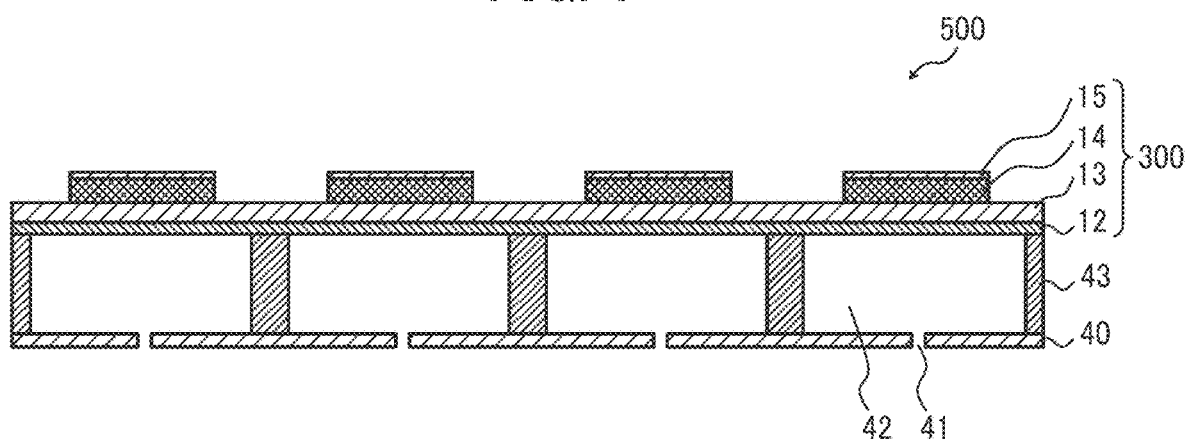
FIG. 7 is a cross-sectional view of another example of the liquid discharge head according to embodiments.

A third embodiment according to the present disclosure is described with reference to FIGS. 6 and 7. Descriptions of features similar to the features of the above-described embodiments are omitted. FIG. 6 illustrates a head 500 including one electromechanical transducer element 19. FIG. 7 illustrates a head 500 including a plurality of electromechanical transducer elements 19.

In the present embodiment, the substrate 11 includes a plurality of individual chambers 42. The head 500 includes a nozzle plate 40 bonded to the individual chamber 42 side (lower side in FIG. 6) opposite to the electromechanical transducer element 19 side (upper side in FIG. 6). The nozzle plate 40 includes nozzles 41 from which a liquid is discharged. The individual chambers 42 are partitioned by the partition walls 43. In the present embodiment, the partition walls 43 are made of silicon (Si).

Further, in the present embodiment, the volume resistivity of the partition wall 43 is preferably 10 Ω·cm or less and is more preferably 1 Ω·cm or less. The volume resistivity of the partition wall 43 affects the polarization process of the electromechanical transducer film 14. When the volume resistivity of the partition wall 43 satisfies the above described range (10 Ω·cm or less and is more preferably 1 Ω·cm or less), the discharge characteristic of the head 500 is improved at the durability test by continuous driving. When the volume resistivity of the partition wall 43 is greater than 10 Ω·cm, for example, 1.0×10$^5$ Ω·cm, an initial displacement characteristic is good. However, the displacement characteristics may be deteriorated after the durability test.

The measurement of the volume resistivity of the partition wall 43 is performed after forming the individual chambers 42 in the substrate 11 and bonding the nozzle plate 40 to the substrate 11. The volume resistivity of the silicon layer 21 is measured using a resistivity meter such as a four-terminal method.

The present embodiment illustrated in FIGS. 6 and 7 is one example of the head 500. The head 500 of the present embodiment includes the nozzles 41 to discharge liquid, individual chambers 42 communicated with the nozzles 41, and actuators 300 to generate pressure in the individual chambers 42.

In the present embodiment, a first insulating protective film 17 is formed on the electromechanical transducer element 19 as illustrated in FIG. 6. Thus, the present embodiment can prevent the deterioration of the electromechanical transducer element 19.

According to the present embodiment, the electromechanical transducer element 19 can be formed by a simple manufacturing method that has characteristics equivalent to characteristics of bulk ceramics. Further, a liquid discharge head can be produced by performing etching removal from a back surface of the substrate 11 to form the individual chamber 42 after forming the electromechanical transducer element 19 and bonding the nozzle plate 40 including the nozzles 41 to the partition walls 43. In FIGS. 6 and 7, a liquid supply unit, a flow channel, and a fluid restrictor are omitted.

Fourth Embodiment

Figure 8:
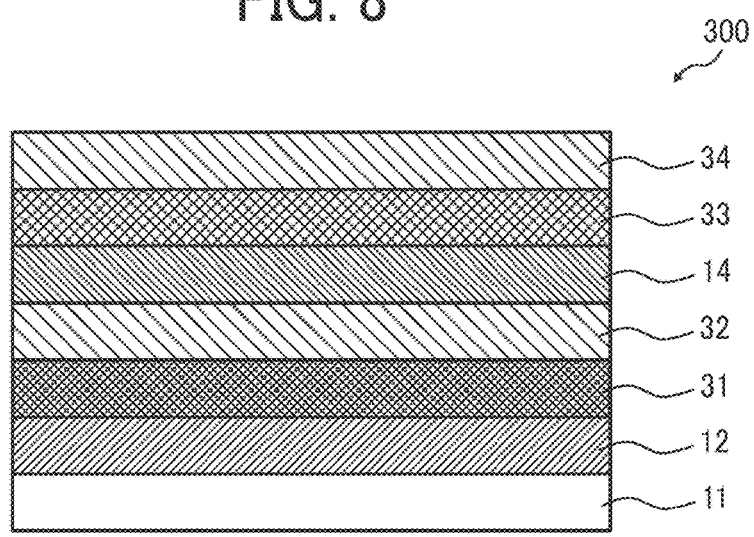
FIG. 8 is a cross-sectional view of still another example of the actuator according to embodiments.

A fourth embodiment according to the present disclosure is described with reference to FIG. 8. Descriptions common to the above-described embodiment are omitted as appropriate. FIG. 8 is a cross-sectional view of the actuator 300 similar to FIG. 1. The actuator 300 in the first embodiment in FIG. 1 includes the lower electrode 13 and the upper electrode 15. The actuator 300 in the fourth embodiment in FIG. 8 is different from the actuator 300 in the first embodiment in FIG. 1 in which the actuator 300 in the fourth embodiment includes a first electrode 31, a second electrode 32, a third electrode 33, and a fourth electrode 34.

The lower electrode 13 and the upper electrode 15 in FIG. 1 are preferably made from a metal layer that can obtain sufficient electric resistance. The lower electrode 13 and the upper electrode 15 in FIG. 1 corresponds to the first electrode 31 and the fourth electrode 34 in the fourth embodiment in FIG. 8.

Further, a layer at an interface of the electromechanical transducer film 14 is made of an oxide electrode layer having conductivity to suppress a decrease in displacement of the electromechanical transducer film 14 when the electromechanical transducer film 14 is continuously driven when the electromechanical transducer film 14 and electrodes in FIG. 8 function as the actuator 300. In the present embodiment, the second electrode 32 and the third electrode 33 are oxide electrode layers. In the following description, details of each component in the present embodiment are given.

[First Electrode and Fourth Electrode]

Platinum having high heat resistance and low reactivity has been conventionally used as a metal material for the first electrode 31 and the fourth electrode 34. However, platinum may not be a sufficient barrier against lead in some cases. Thus, platinum group elements such as iridium and platinum-rhodium, and alloy films of platinum may be used as the metal material for the first electrode 31 and the fourth electrode 34.

When platinum is used for the first electrode 31 and the fourth electrode 34, it is preferable to laminate Ti, TiO$_2$, Ta, Ta$_2$O$_5$, or Ta$_3$N$_5$, for example, first on a base (especially SiO$_2$) before laminating platinum on the base to improve adhesion to the base. Therefore, the first electrode 31 and the fourth electrode 34 may be multilayer structures. For example, the first electrode 31 may have a plurality of layers produced by forming Ti on the diaphragm 12, thermally oxidizing Ti to form an adhesion layer, and further forming platinum on the adhesion layer.

As a method of manufacturing the first electrode 31 and the fourth electrode 34, a vacuum deposition method such as sputtering or vacuum deposition is generally used. The film thickness of the first electrode 31 and the fourth electrode 34 is preferably from 0.05 μm to 1 μm and is more preferably from 0.1 μm to 0.5 μm.

[Second Electrode and Third Electrode]

Examples of the second electrode 32 and the third electrode 33 include SrRuO$_3$ and LaNiO$_3$, for example.

The second electrode 32 affects an orientation control of the PZT film (electromechanical transducer film 14) to be formed on the second electrode 32. Thus, different material is selected according to a direction of preferential orientation. In the fourth embodiment, a seed layer is preferably used for the second electrode 32. Using the seed layer for the second electrode 32 easily makes the preferential orientation of the PZT film (electromechanical transducer film 14) to PZT (100) orientation. Examples of the seed layer include LaNiO$_3$, TrO, TiO$_2$, and PbTiO$_3$, for example. For example, the seed layer is formed on the first electrode 31, and then the PZT film (electromechanical transducer film 14) is formed on the seed layer. The thickness of the second electrode 32 is preferably from 20 nm to 200 nm.

SRO is preferably used as the third electrode 33 employed as the upper electrode. The thickness of the third electrode 33 is preferably from 20 nm to 80 nm and is more preferably from 30 nm to 50 nm. If the thickness of the third electrode 33 is 20 nm or more, an initial displacement and characteristics of displacement deterioration are improved. If the thickness of the third electrode 33 is 80 nm or less, a dielectric strength voltage of PZT can be improved and leakage can be suppressed.

[Electromechanical Transducer Film]

It is preferable to use lead zirconate titanate (PZT) as the electromechanical transducer film 14. PZT is a solid solution of lead zirconate (PbTiO$_3$) and titanic acid (PbTiO$_3$), and characteristics of PZT are different depending on the ratio of the lead zirconate (PbTiO$_3$) to the titanic acid (PbTiO$_3$). Generally, a composition exhibiting excellent piezoelectric properties has a ratio of PbZrO$_3$ to PbTiO$_3$ of 53:47. If the composition is represented as a chemical formula, the composition is represented by Pb (Zr$_{0.53}$, Ti$_{0.47}$) O$_3$, generally, PZT (53/47).

Examples of complex oxides other than PZT include barium titanate and the like. If barium titanate is used for PZT, it is possible to use barium alkoxide and titanium alkoxide compounds as a starting material and to dissolve barium alkoxide and titanium alkoxide compounds in a common solvent to prepare a barium titanate precursor solution. Hereinafter, a case in which the electromechanical transducer film 14 is PZT is described.

The composition ratio of Zr/Ti is preferably 0.40 or more and 0.55 or less and is more preferably 0.45 or more and 0.53 or less when being represented by Ti/(Zr+Ti). When the composition ratio of Zr/Ti is within the above range (0.40 or more and 0.55 or less), it is possible to prevent reduction of the amount of displacement of PZT due to rotational distortion or piezoelectric distortion so that the PZT of the present embodiment can ensure enough displace amount.

In the present embodiment, the degree of orientation of (100) plane is preferably 99% or more when θ-2θ measurement is performed on PZT by X-ray diffraction (XRD) measurement. The diffraction peak shape of (400) plane is preferably separated into three peaks (peak separation). The diffraction peak shape of (400) plane is obtained by varying the tilt angle ($\chi$) at an angle of 2θ at which a peak of diffraction intensity of (200) plane or (002) plane is obtained. The angle of 2θ at which the peak of diffraction intensity of (200) plane or (002) plane is obtained is referred to as "2θ peak position" or "maximum peak position".

The state of the crystal face of PZT can be measured by rocking curve method or measurement with varying a tilt angle.

According to the rocking curve method, the angle of 2θ formed by a direction of an incident X ray and a direction of a detector on PZT is fixed at a position where a diffraction intensity measured by the θ-2θ method is largest, and the diffraction intensity is measured only with slight changes around θ in the angle (ω) formed by the substrate surface of the sample and the incident X ray.

Figure 9:
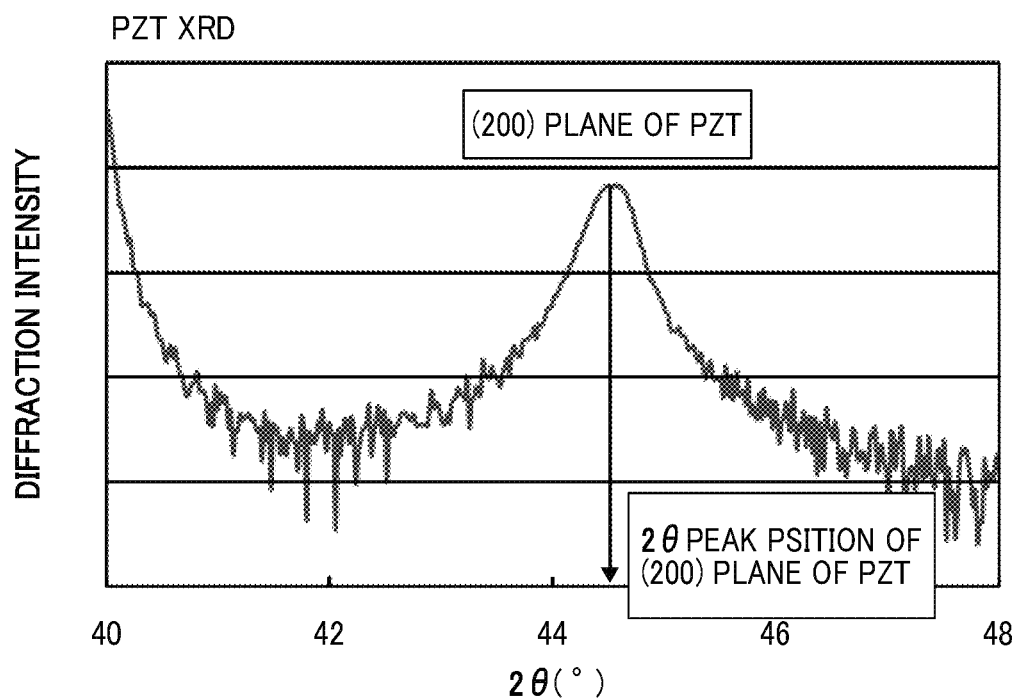
FIG. 9 is a graph of an example of X-ray diffraction (XRD) measurements of an electromechanical transducer film.

FIG. 9 illustrates an example in which θ-2θ measurement is performed on PZT by X-ray diffraction (XRD) measurement. FIG. 9 illustrates the 2θ peak position (maximum peak position) of the PZT (200) plane. Adjusting the composition ratio of Zr/Ti changes a peak position and peak asymmetry of the PZT (200) plane (or PZT (002) plane) as illustrated in FIG. 9.

Figure 10:
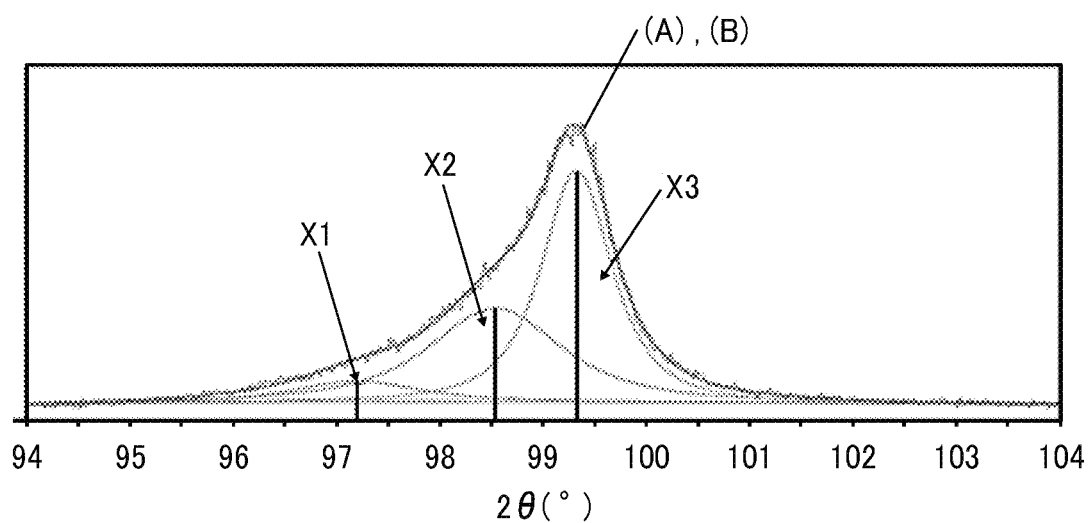
FIG. 10 is a graph of an example of the XRD measurements of the electromechanical transducer film.

FIG. 10 illustrates an example of the XRD measurements obtained when the tilt angle ($\chi$) is varied at the 2θ peak position at which the peak of diffraction intensity of (200) plane or (002) plane is obtained. FIG. 10 focuses on the PZT (400) plane on a high angle side, and the peak top of the (400) plane in this embodiment is around 99 degrees.

Peak separation is performed on the XRD measurements using the XRD diffraction intensity as illustrated in FIG. 10, and the attribution state of the crystal structure of PZT is confirmed. It is preferable that the diffraction intensity has an asymmetric shape at the peak of the diffraction intensity. The peak separation may be performed on the PZT (200) surface. However, it is preferable to perform the peak separation on the PZT (400) surface.

In FIG. 10, the XRD measurements is separated into three of X1 to X3 (three peaks in FIG. 10). In FIG. 10, (A) is a measured value. In FIG. 10, (B) is a value obtained when the three peaks of X1 to X3 are super positioned. Fitting is performed so that the difference between the values (A) and (B) as a fitting residue decreases.

As for the fitting condition, the fitting is performed centering on a 2θ position (angle of 2θ) described in the Joint Committee on Powder Diffraction Standards (JCPDS) or International Centre for Diffraction Data (ICDD) card information after the attribution state of the crystal structure of PZT is estimated to some extent. When the fitting is performed with one separated peak, the fitting is performed according to the 2θ position where the peak intensity becomes maximum.

Figure 11:
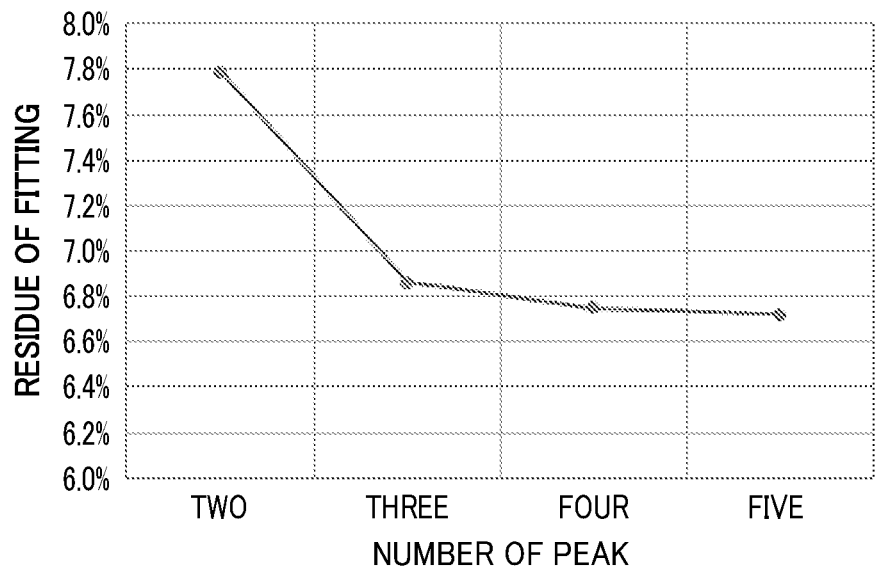
FIG. 11 is a graph illustrating an example of a relation between a peak number and fitting residues obtained by performing peak separation and fitting on the XRD measurements of the electromechanical transducer film.

FIG. 11 is a graph that illustrates a relation between a number of separated peaks in FIG. 10 and fitting residues. Increasing the number of separated peaks reduces the fitting residue. A measure of the fitting residue is 10% or less, for example. The number of separated peaks is determined to a number in which the fitting residue saturates to a certain degree. For example, the number is determined such that the fitting residue falls within 0.5% when the number is changed from n to n+1.

A proportion of X1 to X3 as illustrated in FIG. 10 is varied when the fitting is repeatedly performed. In the present embodiment, an average value of the number of separated peaks when the fitting is repeatedly performed is adopted. Further, the number of separated peaks is calculated from an averaged value of the number of separated peaks in which the number of separated peaks that is extremely deviated during performing fitting is removed. The appropriate number of times of repeating the fitting is about six to ten times.

It is preferable to have the following three crystal structures. That is, the three crystal structure includes two crystal structures of a tetragonal a-domain structure and a c-domain structure, and one crystal structure of rhombohedral, orthorhombic or pseudocubic crystal (see FIG. 12 described below).

Then, whether such three crystal structures are present, that is, whether there is a crystal structure derived from the above crystal structure, is confirmed. To look for the presence of the three crystal structure, the peak separation and the fittings are carried out on a peak state of crystals obtained from the XRD measurement. Then, it is ascertained whether there is a crystal structure attributable to the peak status of the crystals actually obtained.

As illustrated in FIG. 10, the diffraction peak shape is preferably separated into peaks such as three peaks. The diffraction peak shape of the (400) plane (or the (200) plane) is obtained by varying the tilt angle ($\chi$) at the 2θ peak position at which the peak of the diffraction intensity of the (200) plane or (002) plane can be obtained. When the diffraction peaks are separated into three peaks, the diffraction peaks can be said to have three crystal structures.

Further, as described above, in the present embodiment, it is preferable to make the (100) plane to be the preferential orientation. The crystal orientation is expressed as follows.

$\rho(hkl)=I(hkl)/\Sigma I(hkl)$ $\rho(hkl)$ represents the degree of orientation of (hkl) plane orientation. I (hkl) represents the peak intensity of an arbitrary orientation. $\Sigma I$ (hkl) represents a sum of peak intensities.

When the sum of peak intensities obtained by θ-2θ measurement by X-ray diffraction method is taken as 1, the degree of orientation of (100) orientation calculated based on the ratio of the peaks of diffraction intensity of respective orientations is preferably 99% or more and is more preferably 99.5% or more. The orientation can be said "preferentially oriented" when the degree of orientation is 99% or more.

Figure 12A:
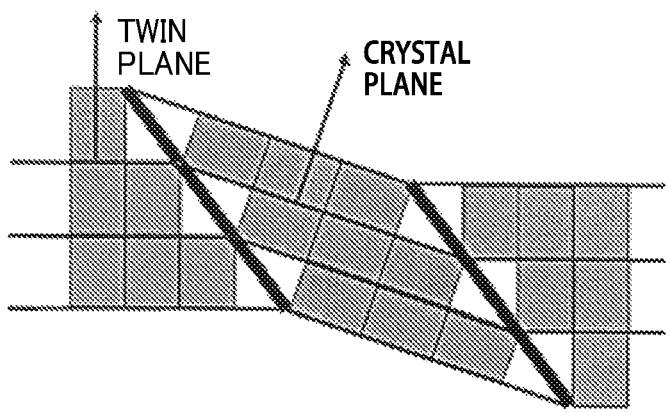
FIGS. 12A and 12B are a schematic view of a crystal structure of the electromechanical transducer film and an example of XRD measurements of the electromechanical transducer film, respectively.
Figure 12B:
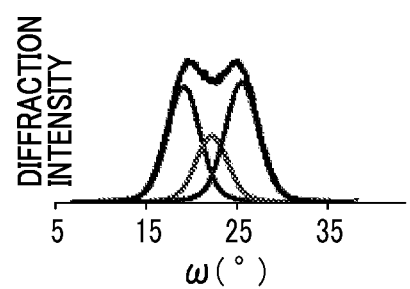

FIG. 12A is a schematic view of a crystal structure when a crystal has (100) preferential orientation. FIG. 12B is a graph of the diffraction intensity measured by slightly changing only the angle (ω) between a substrate surface of a sample and an incident X-ray at vicinity of θ. When the (100) orientation is preferentially oriented, structures having different aspect ratios such as a-domain and c-domain coexist. Thus, the structures have twin planes as illustrated in FIG. 12A and have a crystal plane grown diagonally from the substrate surface. If the crystal has a crystal face as illustrated in FIG. 12A, the crystal structure is attributed to the three peaks as illustrated in FIG. 12B, for example.

Further, when PZT has a tetragonal a-domain and c-domain, the peak separation is performed for the diffraction peak obtained when the tilt angle ($\chi$) is varied at the 2θ peak position at which the peak of the diffraction intensity of the (200) plane or (002) plane can be obtained in the θ-2θ measurement by X-ray diffraction (XRD) measurement for PZT. The lattice constants are determined for peaks of the plurality of peaks corresponding to tetragonal a-domain and c-domain. A ratio of a maximum lattice constant to a minimum lattice constant (maximum lattice constant/minimum lattice constant) is preferably 1.02 or more. A value of the maximum lattice constant is greater than a value of minimum lattice constant. The ratio is more preferably 1.03 or more.

Here, the lattice constant is calculated from following Bragg's law:

$$2d \times \sin\theta = n \times \lambda$$

d: lattice constant
θ: crystalline peak position (angle formed between crystal plane and X-ray)
λ: wavelength of X-ray
n: integer In FIG. 10 of the present embodiment, the lattice constant obtained from the peak position (2θ) of X1 corresponds to the maximum lattice constant and the lattice constant obtained from the peak position (2θ) of X3 corresponds to the minimum lattice constant. The peak of X1 or X3 in FIG. 10 is attributed to the peak of a-domain or c-domain. Thus, X1 may be the a-domain and X3 may be the c-domain. Conversely, X1 may be the c-domain and X3 may be the a-domain.

As the ratio of the maximum lattice constant to the minimum lattice constant of the tetragonal a-domain or c-domain increases, a contribution to the displacement of PZT by the rotational strain increases. Further, as the influence of compressive stress from the diaphragm increases, the ratio of the maximum lattice constant to the minimum lattice constant increases. Therefore, when the ratio of the maximum lattice constant to the minimum lattice constant is 1.02 or more, the contribution to the displacement by the rotational strain can be increased. Further, the stress on the compression side of the diaphragm 12 increases and the displacement amount of the actuator 300 can be further improved. The upper limit value of the ratio between the maximum lattice constant and the minimum lattice constant is not particularly limited. However, the upper limit value of the ratio is preferably 1.06 or less.

[Example of a Method for Manufacturing an Electromechanical Transducer Film]

When PZT is prepared by the Sol-gel method, lead acetate, zirconium alkoxide, or titanium alkoxide compound is used as a starting material. A PZT precursor solution can be prepared by dissolving the starting material in methoxyethanol as a common solvent to obtain a homogeneous solution.

The metal alkoxide compound is easily hydrolyzed by moisture in the atmosphere. Thus, an appropriate amount of a stabilizer such as acetylacetone, acetic acid, diethanolamine or the like may be added as a stabilizer to the precursor solution.

When a PZT film is formed on an entire surface of the base, the PZT film is obtained by forming a coating film by a solution coating method such as spin coating and subjecting each film to a heat process such as solvent drying, thermal decomposition, and crystallization. Transformation from a coating film to a crystallized film involves volumetric shrinkage. In order to obtain a crack-free film, it is preferable to adjust the precursor concentration so that a film thickness of 100 nm or less can be obtained in a single step.

When the PZT film is manufacturing by the inkjet method, it is possible to obtain a patterned film in the same manufacturing flow as the second electrode 32. Surface modifying material differs depending on the material of the base (first electrode 31) of the second electrode 32. When an oxide is used as a base, a silane compound is preferable, and when a metal is used as a base, an alkane thiol is preferable as the surface modifying material.

The film thickness of the electromechanical transducer film 14 is preferably 0.5 to 5 μm and is more preferably 1 μm to 2 μm. If the film thickness is within the above range (0.5 to 5 μm) or over, the displacement of the electromechanical transducer film 14 can be increased. If the film thickness is within the above range (0.5 to 5 μm) or less, a number of steps (layers) of lamination can be reduced so that process time can be reduced.

Fifth Embodiment

Figure 13A:
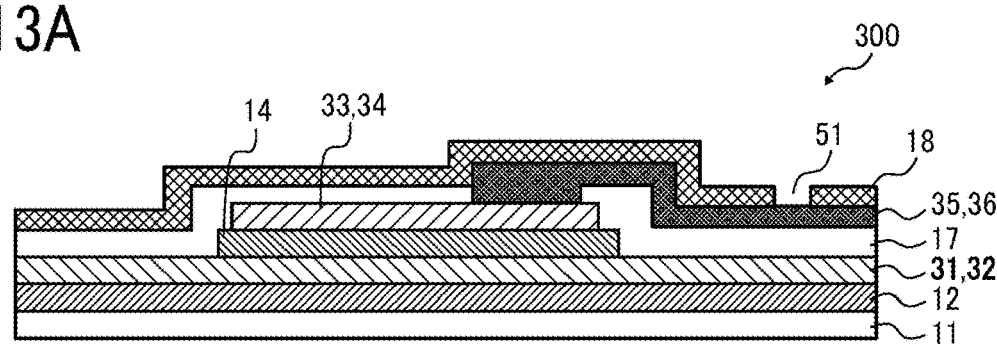
FIGS. 13A and 13B are sectional view and a plan view of another example of the actuator according to embodiments.
Figure 13B:
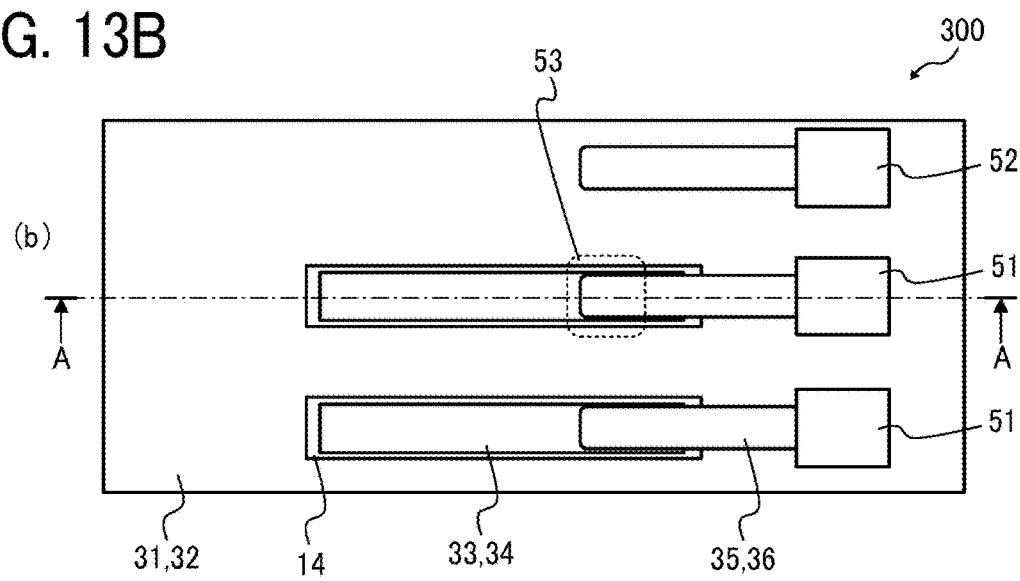

An actuator 300 according to a fifth embodiment is described with reference to FIGS. 13A and 13B. Descriptions common to the above-described embodiment are omitted as appropriate. FIGS. 13A and 13B illustrate the actuator 300 of the fifth embodiment including an insulating protective film and a lead wire. FIG. 13A is a schematic cross-sectional view of the actuator 300. FIG. 13B is a schematic plan view of the main part of the actuator 300. FIG. 13A is a cross-sectional view of the actuator 300 along line A-A in FIG. 13B. In FIG. 13B, illustration of the insulating protective film is omitted.

As illustrated in the drawings, a first insulating protective film 17 is formed on the electromechanical transducer element 19, and the first insulating protective film 17 has a contact hole 53. A fifth electrode 35 and a sixth electrode 36 are formed as lead wires on the first insulating protective film 17, and a second insulating protective film 18 is further formed on the fifth electrode 35 and the sixth electrode 36. The first electrode 31 and the second electrode 32 are electrically connected to the fifth electrode 35 via the contact hole of the first insulating protective film 17 so that there is an electrical continuity between the third electrode 33, the fourth electrode 34, and the sixth electrode 36.

Further, in the present embodiment, the fifth electrode 35 is used as a common electrode, and the sixth electrode 36 is used as an individual electrode. However, the fifth electrode 35 may be used as an individual electrode, and the sixth electrode 36 may be used as a common electrode. The second insulating protective film 18 protects the common electrode and the individual electrode. An opening is formed in a portion of the second insulating protective film 18 and is configured as an electrode pad (PAD). The electrode pad formed for the individual electrode is used as an individual electrode PAD 51. The electrode pad formed for the common electrode is used as a common electrode PAD 52.

[Polarization Process]

Figure 14:
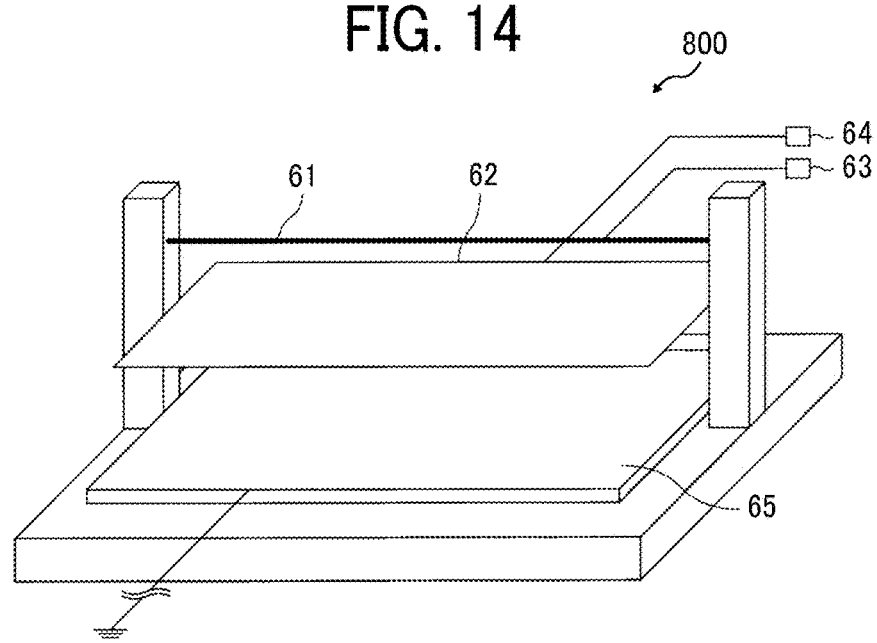
FIG. 14 is a perspective view of an example of a polarization processing apparatus.

FIG. 14 illustrates an example of a polarization processing apparatus 800. Polarization process is performed on the above-described electromechanical transducer element 19 using the polarization processing apparatus 800. The polarization processing apparatus 800 of the present embodiment includes a corona electrode 61 and a grid electrode 62. The corona electrode 61 and the grid electrode 62 are electrically connected to a corona power supply 63 and a grid power supply 64, respectively. The mesh processing is applied to the grid electrode 62. Thus, ions and charges generated by the corona discharge are efficiently discharged onto the sample stage 65 disposed below the corona electrode 61 when a high voltage is applied to the corona electrode 61. The voltage applied to the corona electrode 61 and the grid electrode 62 or the distance between the sample and each electrode may be adjusted to adjust strength of corona discharge.

Further, a temperature control function is provided to a sample stage 65 on which the sample is set. Thus, the polarization processing can be performed on the electromechanical transducer element 19 while heating the electromechanical transducer element 19 up to about 350° C. Ground is installed in the sample stage 65. The polarization processing cannot be performed when no ground is provided.

Figure 15A:
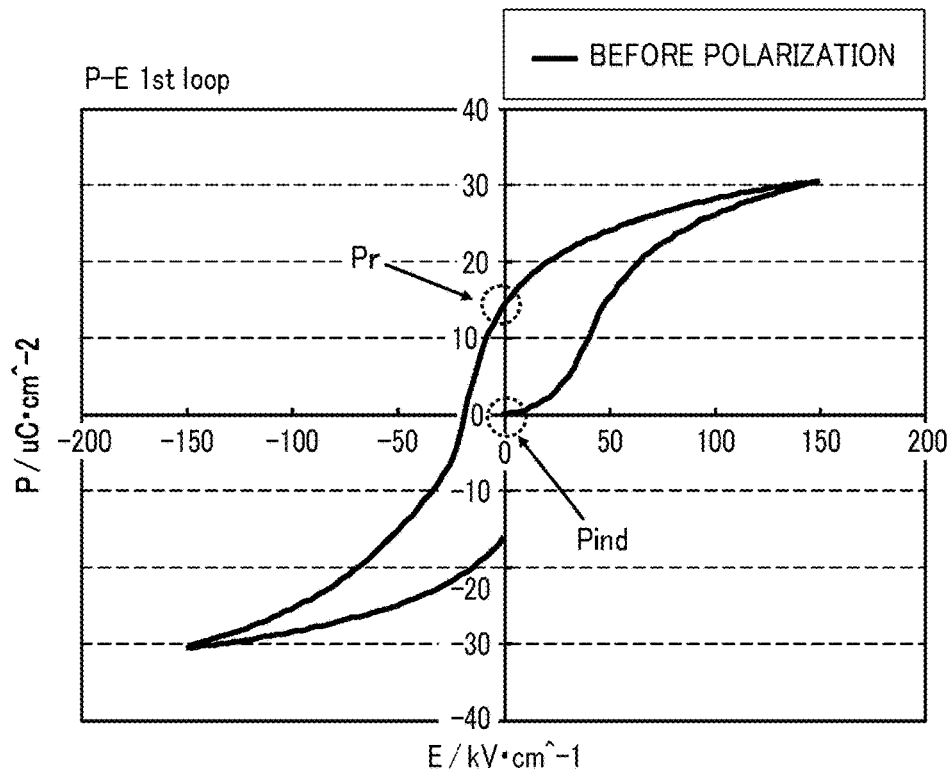
FIGS. 15A and 15B are examples of PE hysteresis loops.
Figure 15B:
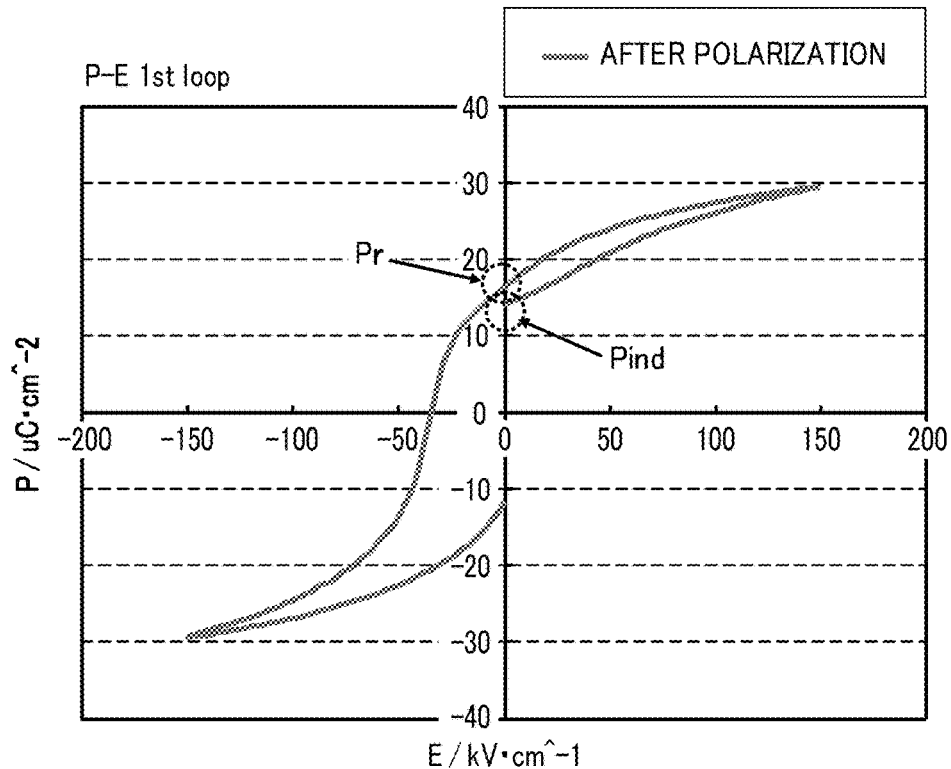

Here, a state of polarization process is determined from a P-E hysteresis loop. FIGS. 15A and 15B illustrate an example of the P-E hysteresis loop. FIG. 15A illustrates an example of the P-E hysteresis loop before the polarization process. FIG. 15B illustrates an example of the P-E hysteresis loop after the polarization process.

As illustrated in FIGS. 15A and 15B, the hysteresis loop is measured while an electric field strength of ±150 kV/cm is applied to the corona electrode 61 and the grid electrode 62. A value of Pr-Pind is defined as the polarizability when the polarization at a first polarization at 0 kV/cm is referred to as Pind, and the polarization at 0 kV/cm is referred to as Pr when the voltage is returned to 0 kV/cm after applying a voltage of +150 kV/cm to the electromechanical transducer element 19. Quality of the polarization state of the electromechanical transducer element 19 is determined based on the polarizability Pr-Pind. The polarizability Pr-Pind is preferably 10 pc/cm$^2$ or less and is more preferably 5/cm$^2$ or less. If the polarizability Pr-Pind is within the above range, deterioration of the displacement of the PZT as a piezoelectric actuator after continuous driving can be prevented.

Figure 16:
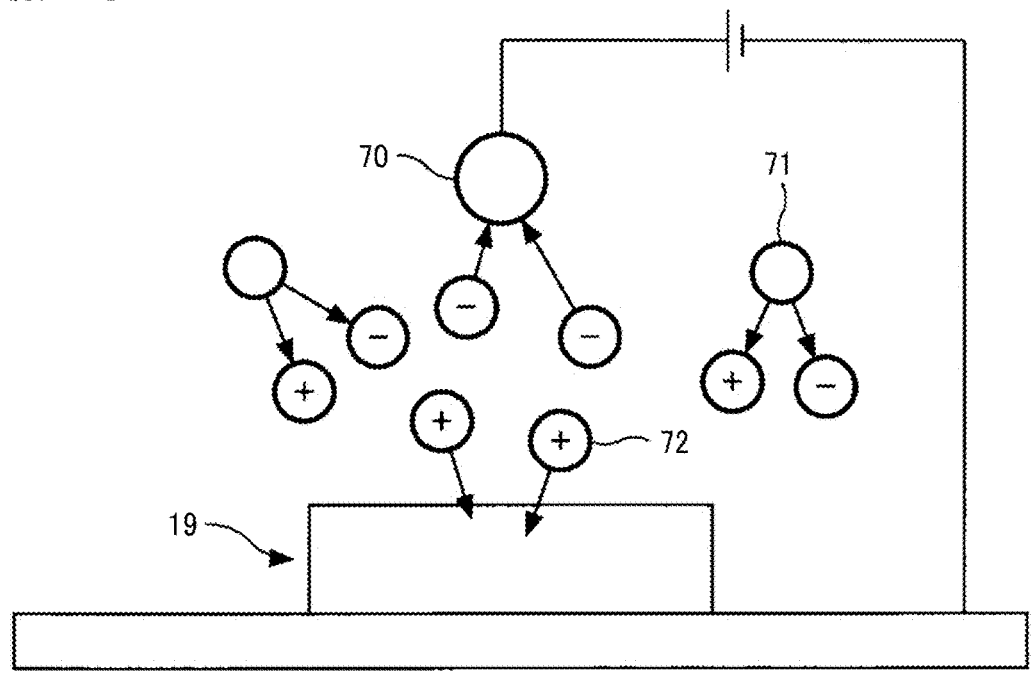
FIG. 16 is a schematic view of a corona discharge process.

FIG. 16 is a schematic view of the polarization processing apparatus 800 for describing the polarization process. As illustrated in FIG. 16, when corona discharge is performed using the corona wire 70, cations 72 are generated by ionizing the molecules 71 in the atmosphere. Passing cations 72 through the PAD section of the electromechanical transducer element 19 (piezoelectric element), electric charge is accumulated in the electromechanical transducer element 19. Then, an internal potential difference is generated by the difference in electric charge between the upper electrode and the lower electrode, and the polarization process is performed on the electromechanical transducer element 19.

Here, it is preferable to accumulate a charge amount of $1\times10^{-8}$ C or more as the charge amount Q necessary for the polarization process. It is more preferable to accumulate a charge amount of $4\times10^{-8}$ C or more. If the accumulated charge amount is within the above range ($1\times10^{-8}$ C or more), the polarization process can be performed satisfactorily. Thus, the present embodiment can prevent deterioration of the displacement of PZT as a piezoelectric actuator after continuous driving.

To obtain the desired polarizability Pr-Pind, it is preferable to adjust the voltage applied to the corona electrode 61 and the grid electrode 62 illustrated in FIG. 14 to adjust the distance between the sample stage 65 and the corona electrode 61 or the grid electrode 62. To obtain a desired polarizability Pr-Pind, it is preferable to generate a high electric field to the electromechanical transducer film 14.

[First Insulating Protective Film]

As the first insulating protective film 17, it is preferable to select a material which prevents damage to the electromechanical transducer element 19 by a process of film formation and etching and has a property that hardly permeates moisture in the atmosphere. For example, a dense inorganic material is preferably used as the first insulating protective film 17. Further, it is necessary to increase a film thickness to obtain sufficient protection performance for an organic material. When the first insulating protective film 17 is made thick, the displacement of the diaphragm during vibration is remarkably hindered. Thus, the discharge performance of the head 500 may deteriorate.

As the first insulating protective film 17, it is preferable to use an oxide, a nitride, a carbonized film, for example, to obtain a high protective performance with a thin film. It is preferable to select a material having high adhesiveness to the electrode material, the piezoelectric material, and the diaphragm material that is to be the base of the first insulating protective film 17.

As a film forming method of the first insulating protective film 17, it is preferable to select the film forming method that does not damage the electromechanical transducer element 19. A plasma CVD method in which a reactive gas is converted into a plasma and deposited on a substrate or a sputtering method in which a plasma is deposited by colliding with a target material may cause damage to the electromechanical conversion element.

As a preferable film formation method, there is an evaporation method, an Atomic Layer Deposition (ALD) method, for example, can be used. The ALD method is preferable among the film forming methods. The ALD method has a wide choice of materials that can be used.

Preferred materials include oxide film used for ceramic material such as $Al_2O_3$, $ZrO_2$, $Y_2O_3$, $Ta_2O_3$, and $TiO_2$, for example. Using above-described material such as the oxide film and especially using the ALD method can prepare a thin film having a very high film density and can suppress the damage to the electromechanical transducer element 19 occurred during the film forming process.

The film thickness of the first insulating protective film 17 is preferably sufficiently large to ensure a protection performance of the electromechanical transducer element 19. Further, the film thickness of the first insulating protective film 17 is preferably thin as possible so as not to hinder the displacement of the diaphragm 12. The film thickness of the first insulating protective film 17 is preferably 20 nm to 100 nm. When the film thickness is 20 nm or more, a function as a protective layer of the electromechanical transducer element 19 can be obtained. Thus, the first insulating protective film 17 can prevent deterioration in the performance of the electromechanical transducer element 19. When the film thickness is 100 nm or less, the first insulating protective film 17 can suppress a decrease in the displacement of the diaphragm 12 and thus can suppress a decrease in the discharge efficiency of the head 500.

Further, the first insulating protective film 17 may have a plurality of layers, for example, two layers. If the first insulating protective film 17 includes the plurality of layers, the first insulating protective film 17 may have a configuration in which a second layer of the first insulating protective film 17 includes an opening in a vicinity of the second electrode 32 so as not to significantly hamper the displacement of the diaphragm 12 during vibration and to increase the thickness of the second layer of the first insulating protective film 17. As the second layer of the first insulating protective film 17, any oxide, nitride, carbide or a complex compound of oxide, nitride, and carbide may be used. It is preferable to use $SiO_2$ generally used in semiconductor devices for the second layer of the first insulating protective film 17.

Any suitable film forming method may be used as a method of forming the second layer of the first insulating protective film 17. For example, a chemical vapor deposition (CVD) method, a sputtering method and the like may be used. Considering coating a step of a pattern forming part such as an electrode forming part, it is preferable to use the CVD method capable of isotropically forming a film.

The film thickness of the second layer of the first insulating protective film 17 is preferably a thickness in which the second layer may is not dielectric breakdown by a voltage applied to the lower electrode 13 and an individual electrode wiring. Thus, it is preferable to set the electric field strength applied to an insulating film within a range not causing dielectric breakdown on the insulating film. Considering a surface property of a first layer of the first insulating protective film 17 and pinholes, for example, the film thickness of the first insulating protective film 17 including a plurality of layers is preferably 200 nm or more and is more preferably 500 nm or more.

[Fifth Electrode and Sixth Electrode]

Metal electrode materials such as an Ag alloy, Cu, Al, Au, Pt, Ir or the like are preferable as the fifth electrode 35 and the sixth electrode 36. As a method of manufacturing the fifth electrode 35 and the sixth electrode 36, it is preferable to prepare an electrode by using a sputtering method or a spin coating method, for example, and then obtain a desired pattern by photolithographic etching or the like.

The film thickness of the fifth electrode 35 and the sixth electrode 36 is preferably 0.1 to 20 μm and is more preferably 0.2 to 10 μm. When the film thickness of the fifth electrode 35 and the sixth electrode 36 is 0.1 μm or more, the fifth electrode 35 and the sixth electrode 36 can prevent an increase of the resistance so that a sufficient electric current can be flow into the fifth electrode 35 and the sixth electrode 36. Thus, the head 500 including the fifth electrode 35 and the sixth electrode 36 can stably discharge the liquid. When the film thickness of the fifth electrode 35 and the sixth electrode 3 is 20 μm or less, the process time of manufacturing the fifth electrode 35 and the sixth electrode 36 can be shortened.

A contact hole having an area of 10 μm×10 μm, for example, may be formed as the common electrode and the individual electrode. A contact resistance of the contact hole is preferably 10Ω or less as the common electrode and 1Ω or less as the individual electrode. The contact resistance of the contact hole is more preferably 5Ω or less as the common electrode and 0.5Ω or less as the individual electrode. If the contact resistance of the contact hole is within the above-described range, the present embodiment can prevent problems occurring during discharging the liquid.

[Second Insulating protective film]

The second insulating protective film 18 functions as a passivation layer for protecting the individual electrode wiring and a common electrode wiring. In FIGS. 13A and 13B, the individual electrode and the common electrode are covered except an individual electrode leading portion and a common electrode leading portion.

Using the second insulating protective film 18 enable a use of an inexpensive aluminum (Al) or alloy material containing Al as main component as the electrode material. Thus, the head 500 of the present embodiment is low cost and has high reliability.

As the material of the second insulating protective film 18, any inorganic material and organic material can be used. However, a material having low moisture permeability is preferable as the material of the second insulating protective film 18.

Examples of inorganic material include oxide, nitride, and carbide and the like. Examples of the organic material include polyimide, acrylic resin, urethane resin and the like. The film thickness of the second insulating protective film 18 has to be large if the organic material is used. Thus, patterning of the second insulating protective film 18 may become difficult. The inorganic material can exhibit a wiring protection function with a thin film. Therefore, the inorganic material is preferably used as the material of the second insulating protective film 18. Particularly, using $Si_3N_4$ on the Al wiring is preferable because the technology of using $Si_3N_4$ on the Al wiring is a proven technology in semiconductor devices.

The film thickness of the second insulating protective film 18 is preferably 200 nm or more and is more preferably 500 nm or more. If the film thickness of the second insulating protective film 18 is within the above range, the second insulating protective film 18 has sufficient passivation function and thus can prevent breakage due to corrosion of the wiring material and prevent deterioration of reliability of the discharge property of the head 500.

Further, the second insulating protective film 18 preferably includes an opening on the electromechanical transducer element 19 and on the diaphragm 12 around the electromechanical transducer element 19. Thus, the second insulating protective film 18 of the present embodiment does not hamper the displacement of the diaphragm 12 and further improve the discharge characteristics and reliability of the head 500.

Further, as illustrated in FIGS. 13A and 13B, a part of the second insulating protective film 18 is opened, and the individual electrode PAD 51 and the common electrode PAD 52 are formed. A method of forming the opening may be appropriately selected. The electromechanical transducer element 19 is protected by the first insulating protective film 17. Thus, the opening can be formed by, for example, a photolithography method or dry etching.

The area of the PAD part is preferably 50×50 $\mu m^2$ or more and is more preferably 100×300 $\mu m^2$ or more. Thus, the present embodiment can satisfactory perform the polarization process and thus can suppress deterioration of displacement of the actuator 300 after continuous driving of the actuator 300.

[Liquid Discharge Device and Liquid Discharge Apparatus]

Figure 17:
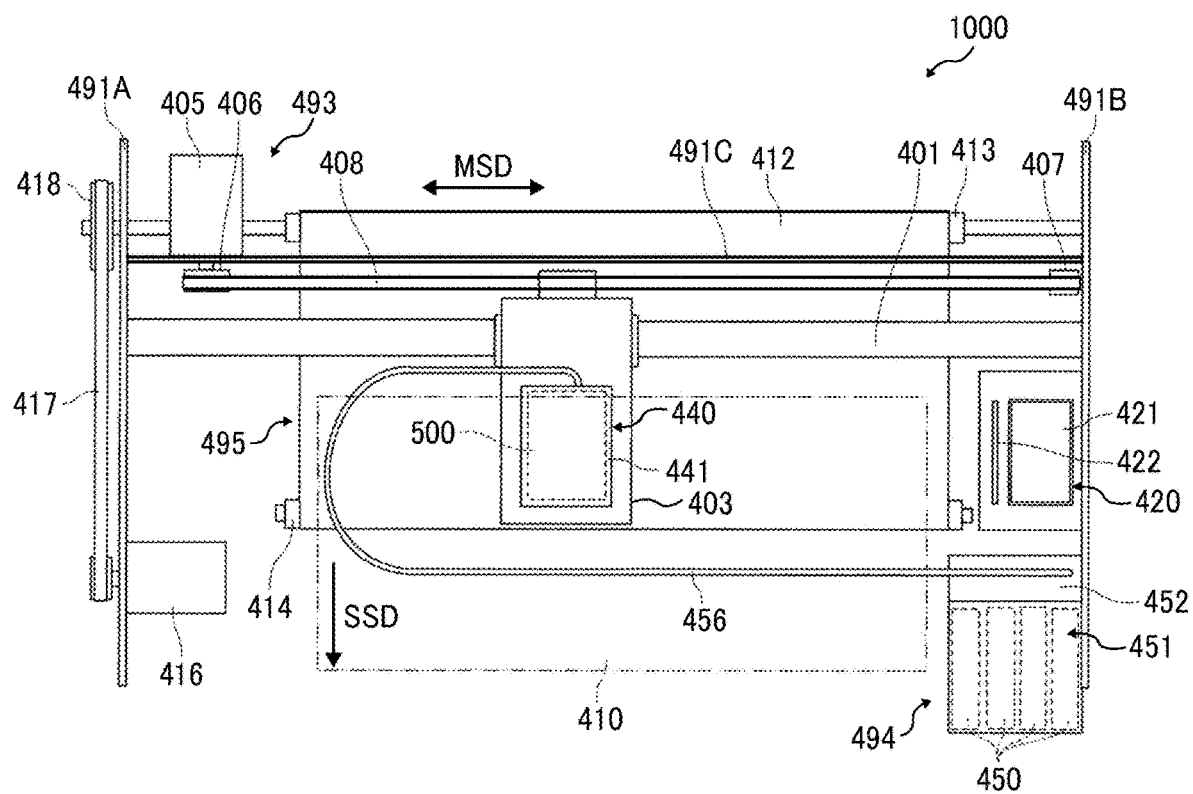
FIG. 17 is a plan view of a liquid discharge apparatus according embodiments.
Figure 18:
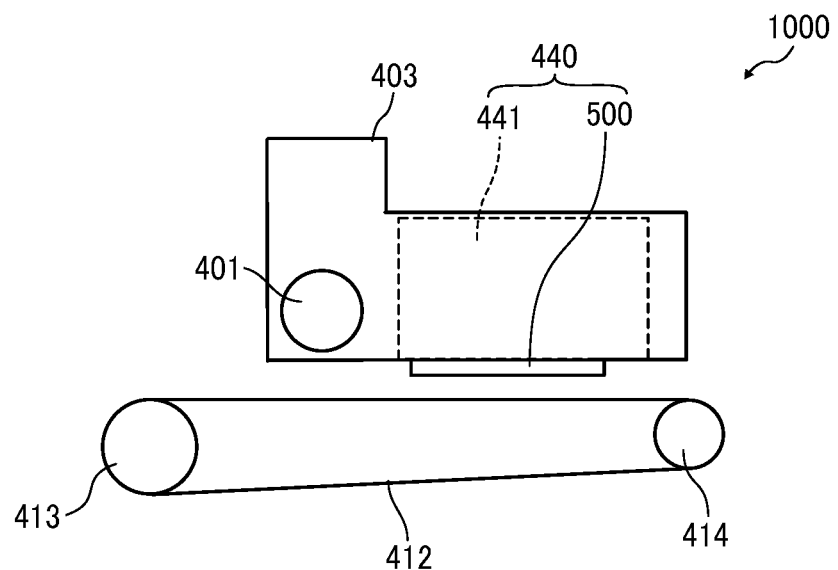
FIG. 18 is a side view of a portion of the liquid discharge apparatus of FIG. 17.

Next, a liquid discharge apparatus 1000 according to a present embodiment is described with reference to FIGS. 17 and 18. FIG. 17 is a plan view of a portion of the liquid discharge apparatus 1000. FIG. 18 is a side view of a portion of the liquid discharge apparatus 1000 of FIG. 17.

A liquid discharge apparatus 1000 according to the present embodiment is a serial-type apparatus in which a main scan moving unit 493 (drive unit) reciprocally moves a carriage 403 in a main scanning direction indicated by arrow MSD in FIG. 17. The main scan moving unit 493 includes a guide 401, a main scanning motor 405, and a timing belt 408, for example. The guide 401 is bridged between a left side plate 491A and a right side plate 491B that movably holds the carriage 403. The main scanning motor 405 reciprocally moves the carriage 403 in the main scanning direction MSD via the timing belt 408 bridged between a driving pulley 406 and a driven pulley 407.

The carriage 403 mounts a liquid discharge device 440. The head 500 according to the present embodiment and a head tank 441 forms the liquid discharge device 440 as a single unit. The head 500 of the liquid discharge device 440 discharges liquid of each color, for example, yellow (Y), cyan (C), magenta (M), and black (K). The head 500 includes nozzle arrays each including a plurality of nozzles 41 arrayed in row in a sub-scanning direction, which is indicated by arrow SSD in FIG. 17, perpendicular to the main scanning direction MSD. The head 500 is mounted to the carriage 403 so that ink droplets are discharged downward.

The liquid stored in liquid cartridges 450 are supplied to the head tank 441 by a supply unit 494 for supplying the liquid stored outside the head 500 to the head 500.

The supply unit 494 includes a cartridge holder 451 which is a filling section for mounting the liquid cartridges 450, a tube 456, a liquid feed unit 452 including a liquid feed pump, and the like. The liquid cartridges 450 are detachably attached to the cartridge holder 451. The liquid is supplied to the head tank 441 by the liquid feed unit 452 via the tube 456 from the liquid cartridges 450.

The liquid discharge apparatus 1000 includes a conveyance unit 495 to convey a recording media sheet 410. The conveyance unit 495 includes a conveyance belt 412 as a conveyance unit and a sub-scanning motor 416 for driving a conveyance belt 412.

The conveyance belt 412 attracts the sheet 410 and conveys the sheet 410 at a position facing the head 500. The conveyance belt 412 is an endless belt and is stretched between a conveyance roller 413 and a tension roller 414. Attraction of the sheet 410 to the conveyance belt 412 may be applied by electrostatic adsorption, air suction, or the like.

The conveyance roller 413 is driven and rotated by the sub-scanning motor 416 via a timing belt 417 and a timing pulley 418, so that the conveyance belt 412 circulates in the sub-scanning direction SSD.

At one side in the main scanning direction MSD of the carriage 403, a maintenance unit 420 to maintain and recover the head 500 in good condition is disposed on a lateral side of the conveyance belt 412.

The maintenance unit 420 includes, for example, a cap 421 to cap a nozzle face 41*f* of the head 500 and a wiper 422 to wipe the nozzle face 41*f*. The nozzle face 41*f* is a surface on which the nozzles 41 are formed as illustrated in FIG. 6.

The main scan moving unit 493, the supply unit 494, the maintenance unit 420, and the conveyance unit 495 are mounted to a housing that includes the left side plate 491A, the right side plate 491B, and a rear side plate 491C.

In the liquid discharge apparatus 1000 thus configured, the sheet 410 is conveyed on and attracted to the conveyance belt 412 and is conveyed in the sub-scanning direction SSD by the cyclic rotation of the conveyance belt 412.

The head 500 is driven in response to image signals while the carriage 403 moves in the main scanning direction MSD, to discharge liquid to the sheet 410 stopped, thus forming an image on the sheet 410.

As described above, the liquid discharge apparatus 1000 includes the head 500 according to an embodiment of the present disclosure, thus allowing stable formation of high quality images.

Figure 19:
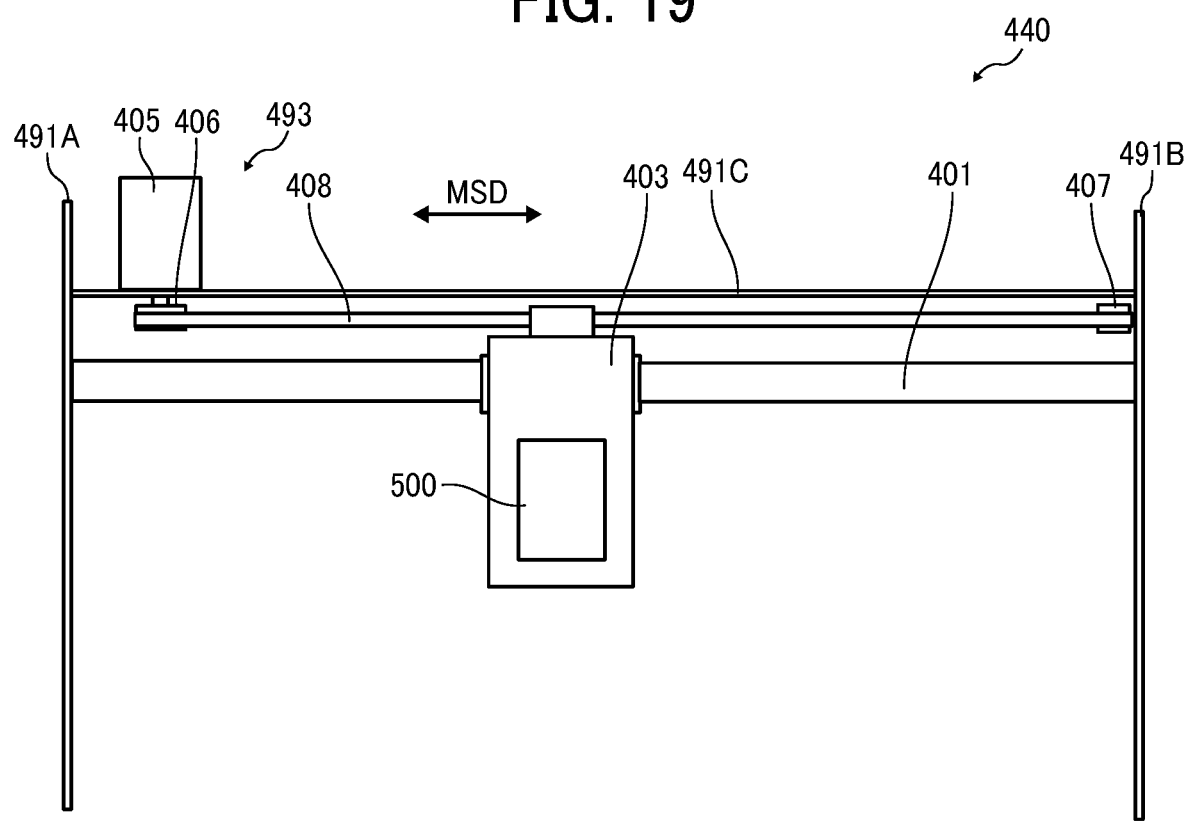
FIG. 19 is a plan view of an example of a liquid discharge device according to embodiments.

Next, another example of the liquid discharge device 440 according to embodiments is described with reference to FIG. 19. FIG. 19 is a plan view of a portion of another example of the liquid discharge device 440.

The liquid discharge device 440 includes the housing, the main scan moving unit 493, the carriage 403, and the head 500 among components of the liquid discharge apparatus 1000. The left side plate 491A, the right side plate 491B, and the rear side plate 491C forms the housing.

Note that, in the liquid discharge device 440, at least one of the maintenance unit 420 and the supply unit 494 described above may be mounted on, for example, the right side plate 491B.

Figure 20:
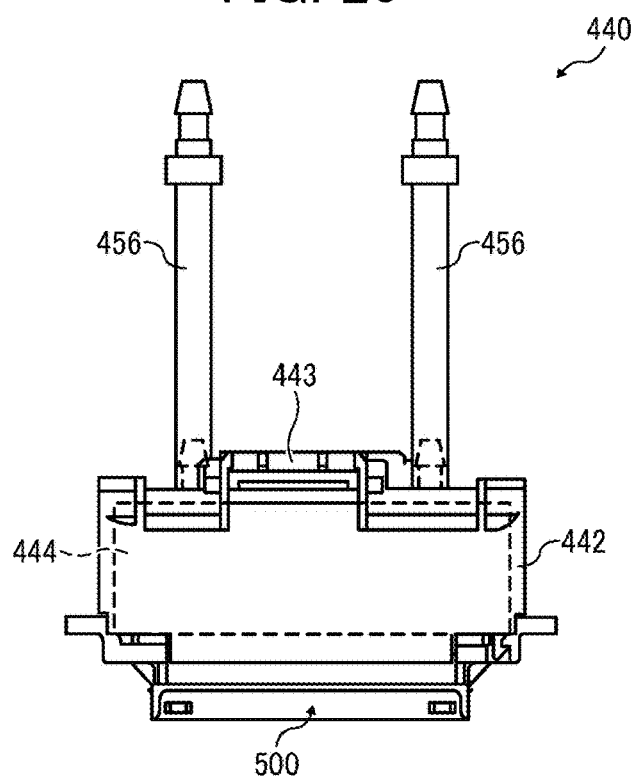
FIG. 20 is a front view of another example of the liquid discharge device according to embodiments.

Next, still another example of the liquid discharge device 440 according to embodiments is described with reference to FIG. 20. FIG. 20 is a front view of still another example of the liquid discharge device 440.

The liquid discharge device 440 includes the head 500 to which a channel part 444 is mounted and a tube 456 connected to the channel part 444.

Further, the channel part 444 is disposed inside a cover 442. Instead of the channel part 444, the liquid discharge device 440 may include the head tank 441. A connector 443 electrically connected with the head 500 is provided on an upper part of the channel part 444.

In the above-described embodiments, the "liquid discharge apparatus" includes the liquid discharge head or the liquid discharge device and drives the liquid discharge head to discharge liquid. The liquid discharge apparatus may be, for example, an apparatus capable of discharging liquid to a material to which liquid can adhere and an apparatus to discharge liquid toward gas or into liquid.

The "liquid discharge apparatus" may include devices to feed, convey, and eject the material on which liquid can adhere. The liquid discharge apparatus may further include a pretreatment apparatus to coat a treatment liquid onto the material, and a post-treatment apparatus to coat a treatment liquid onto the material, onto which the liquid has been discharged.

The "liquid discharge apparatus" may be, for example, an image forming apparatus to form an image on a sheet by discharging ink, or a three-dimensional fabrication apparatus to discharge a fabrication liquid to a powder layer in which powder material is formed in layers to form a three-dimensional fabrication object.

The "liquid discharge apparatus" is not limited to an apparatus to discharge liquid to visualize meaningful images, such as letters or figures. For example, the liquid discharge apparatus may be an apparatus to form meaningless images, such as meaningless patterns, or fabricate three-dimensional images.

The above-described term "material on which liquid can be adhered" represents a material on which liquid is at least temporarily adhered, a material on which liquid is adhered and fixed, or a material into which liquid is adhered to permeate. Examples of the "material on which liquid can be adhered" include recording media, such as paper sheet, recording paper, recording sheet of paper, film, and cloth, electronic component, such as electronic substrate and piezoelectric element, and media, such as powder layer, organ model, and testing cell. The "material on which liquid can be adhered" includes any material on which liquid is adhered, unless particularly limited.

Examples of the "material on which liquid can be adhered" include any materials on which liquid can be adhered even temporarily, such as paper, thread, fiber, fabric, leather, metal, plastic, glass, wood, ceramic, construction materials (e.g., wall paper or floor material), and cloth textile.

Examples of the "liquid" are, e.g., ink, treatment liquid, DNA sample, resist, pattern material, binder, fabrication liquid, or solution and dispersion liquid including amino acid, protein, or calcium.

The "liquid discharge apparatus" may be an apparatus to relatively move a liquid discharge head and a material on which liquid can be adhered. However, the liquid discharge apparatus is not limited to such an apparatus. For example, the liquid discharge apparatus may be a serial head apparatus that moves the liquid discharge head or a line head apparatus that does not move the liquid discharge head.

Examples of the "liquid discharge apparatus" further include a treatment liquid coating apparatus to discharge a treatment liquid to a sheet surface to coat the sheet with the treatment liquid to reform the sheet surface and an injection granulation apparatus to discharge a composition liquid including a raw material dispersed in a solution from a nozzle to mold particles of the raw material.

The "liquid discharge device" is an assembly of parts relating to liquid discharge. The term "liquid discharge device" represents a structure including the liquid discharge head and a functional part(s) or mechanism combined to the liquid discharge head to form a single unit. For example, the "liquid discharge device" includes a combination of the liquid discharge head with at least one of a head tank, a carriage, a supply unit, a maintenance unit, and a main scan moving unit.

Examples of the "single unit" include a combination in which the head and one or more functional parts and devices are secured to each other through, e.g., fastening, bonding, or engaging, and a combination in which one of the head and the functional parts and devices is movably held by another. Further, the head, the functional parts, and the mechanism may be configured to be detachable from each other.

The liquid discharge device may be, for example, formed by the liquid discharge head and the head tank as a single unit, such as the liquid discharge device 440 illustrated in FIG. 18. Alternatively, the liquid discharge head and the head tank coupled (connected) with a tube or the like may form the liquid discharge device as a single unit. A unit including a filter may be added at a position between the head tank and the liquid discharge head of the liquid discharge device.

The liquid discharge head and the carriage may form the "liquid discharge device" as a single unit.

In still another example, the liquid discharge device includes the liquid discharge head movably held by a guide that forms part of a main scan moving unit, so that the liquid discharge head and the main scan moving unit form a single unit. Like the liquid discharge device 440 illustrated in FIG. 19, the liquid discharge head, the carriage, and the main scan moving unit may form the liquid discharge device as a single unit.

In still another example, the cap that forms part of the maintenance unit is secured to the carriage mounting the liquid discharge head so that the liquid discharge head, the carriage, and the maintenance unit form a single unit as the liquid discharge device.

Like the liquid discharge device 440 illustrated in FIG. 20, the tube is connected to the liquid discharge head mounting the head tank or the channel part so that the liquid discharge head and the supply unit form a single unit as the liquid discharge device.

The main scan moving unit may be a guide only. The supply unit may be a tube(s) only or a loading unit only.

The pressure generator used in the liquid discharge head is not limited to a particular-type of pressure generator. The pressure generator is not limited to the piezoelectric actuator (or a layered-type piezoelectric element) described in the above-described embodiments, and may be, for example, a thermal actuator that employs a thermoelectric conversion element, such as a thermal resistor or an electrostatic actuator including a diaphragm and opposed electrodes.

The terms "image formation", "recording", "printing", "image printing", and "fabricating" used herein may be used synonymously with each other.

[One Embodiment of a Liquid Discharge Apparatus]

Figure 21:
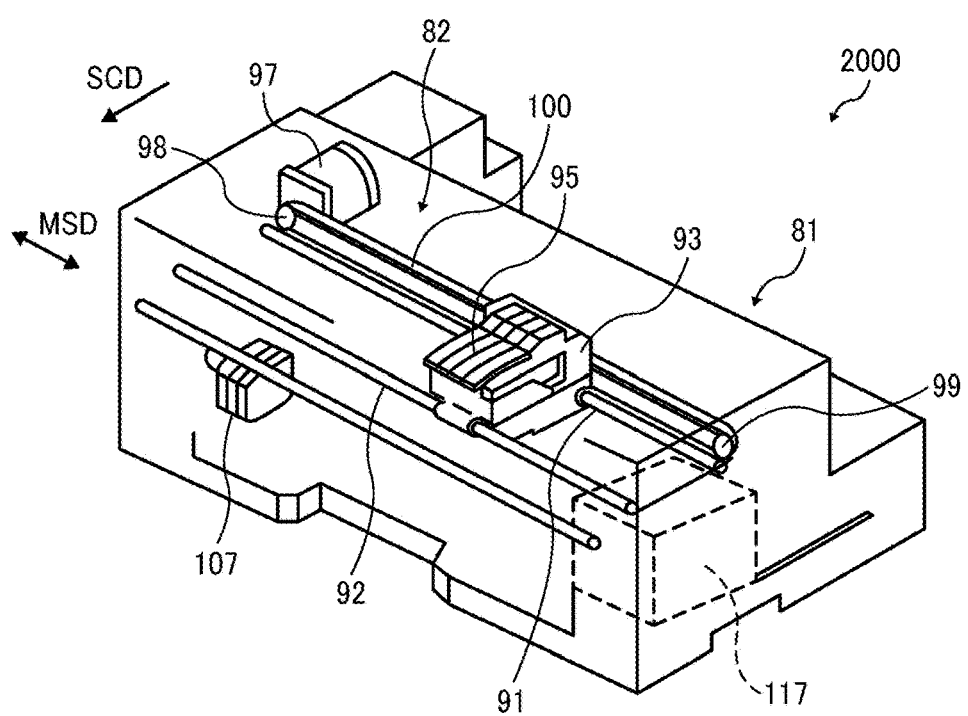
FIG. 21 is a perspective view of another example of a liquid discharge apparatus according to embodiments.

Next, a liquid discharge apparatus including the electromechanical transducer element 19 according to embodiments is described with reference to FIGS. 21 and 22. In the present embodiment, an inkjet recording apparatus 2000 is described as an example of the liquid discharge apparatus. FIG. 21 is a perspective view of the inkjet recording apparatus 2000. FIG. 22 is a side view of a mechanical section of the inkjet recording apparatus 2000 of FIG. 21.

The inkjet recording apparatus 2000 includes a carriage 93 movable in a main scanning direction inside an apparatus body 81, recording heads 94 formed by the heads 500 according to the above-described embodiments mounted on the carriage 93, and ink cartridges 95 for supplying ink to the recording heads 94. The main scanning direction is indicated by arrow MSD in FIG. 21. The inkjet recording apparatus 2000 further includes a sheet feeding cassette 84 (sheet tray) to stack a large number of sheets 83 as recording media. The sheet feeding cassette 84 is attached to a lower portion of the apparatus body 81 in such a manner that the sheet feeding cassette 84 can be inserted into and removed from the front side of the apparatus body 81. In addition, a manual feed tray 85 for manually feeding sheets 83 is disposed to be tiltable to open. Further, the sheets 83 fed from the sheet feeding cassette 84 or the manual feed tray 85 is taken in, the required image is recorded by the printing mechanism 82, and then ejected to a sheet ejection tray 86 mounted on the rear side.

The printing mechanism 82 holds the carriage 93 with a main guide rod 91 and a sub-guide rod 92 so that the carriage 93 is slidable in the main scanning direction MSD. The main guide rod 91 and the sub-guide rod 92 are guides laterally bridged between left and right side plates. The carriage 93 mounts recording heads 94 that includes four inkjet heads for discharging droplets of yellow (Y), cyan (C), magenta (M), and black (BK) inks, respectively. The inkjet heads each include multiple ink discharge nozzle arrays. The recording heads 94 are mounted on the carriage 93 with the multiple ink discharge nozzle arrays intersecting with the main scanning direction MSD and the ink droplet discharging direction coincident with a downward direction. The ink cartridges 95 to supply ink of the respective colors to the recording heads 94 are replaceable and mounted on the carriage 93. Each of the recording heads 94 has a same configuration as the heads 500 as described in FIGS. 6 and 7.

Each of the ink cartridges 95 has an atmosphere communication port, a supply port, and a porous body. The atmosphere communication port is disposed at an upper portion of each ink cartridge 95 to communicate with the atmosphere. The supply port is disposed at a lower portion of each ink cartridge 95 to supply ink to the recording heads 94. The porous body is disposed inside each ink cartridge 95 to be filled with ink. Ink to be supplied to the recording heads 94 is kept at a slight negative pressure in the ink cartridges 95 by capillary force of the porous body. Although the recording heads 94 of each color are used in FIGS. 21 and 22 as the recording heads, the recording head 94 may be a single head having nozzles discharging ink droplets of each color.

A rear side (a downstream side in a sheet conveyance direction) of the carriage 93 is slidably fitted to the main guide rod 91, and a front side (an upstream side in a sheet conveyance direction) of the carriage 93 is slidably mounted to the sub-guide rod 92. The sheet conveyance direction is indicated by arrow SCD in FIGS. 21 and 22. The sheet conveyance direction SCD is perpendicular to the main scanning direction MSD. A timing belt 100 is stretched between a driving pulley 98, which is driven to rotate by a main scanning motor 97, and a driven pulley 99 to move the carriage 93 for scanning in the main scanning direction MSD. The timing belt 100 is secured to the carriage 93. The carriage 93 is reciprocally moved by forward and reverse rotations of the main scanning motor 97.

The inkjet recording apparatus 2000 further includes a sheet feed roller 101, a friction pad 102, a sheet guide 103, a conveyance roller 104, a conveyance roller 105, and a leading end roller 106 to convey the sheet 83, which is set in the sheet feeding cassette 84, to a portion below the recording heads 94. The sheet feed roller 101 and the friction pad 102 separates and feeds the sheets 83 sheet by sheet from the sheet feeding cassette 84. The sheet guide 103 guides the sheets 83, and the conveyance roller 104 reverses and conveys the sheet 83 fed from the sheet feed roller 101. The conveyance roller 105 is pressed against a circumferential surface of the conveyance roller 104. The leading end roller 106 defines an angle at which the sheet 83 is fed from the conveyance roller 105 and the conveyance roller 104. The conveyance roller 104 is driven to rotate by a sub-scanning motor 107 via a gear train.

The inkjet recording apparatus 2000 further includes a print receiver 109 disposed below the recording heads 94. The print receiver 109 is a sheet guide to guide the sheet 83, which is fed from the conveyance roller 104, in a range corresponding to a range of movement of the carriage 93 in the main scanning direction MSD. On a downstream side of the print receiver 109 in the sheet conveyance direction MSD, the inkjet recording apparatus 2000 includes a conveyance roller 111, a spur roller 112, a sheet ejection roller 113, a spur roller 114, and guides 115 and 116. The conveyance roller 111 is driven to rotate with the spur roller 112 to feed the sheet 83 in a sheet ejection direction. The sheet ejection roller 113 and the spur roller 114 further feed the sheet 83 to the sheet ejection tray 86. The guides 115 and 116 form a sheet ejection path.

In recording, the inkjet recording apparatus 2000 drives the recording heads 94 according to image signals while moving the carriage 93, to discharge ink onto the sheet 83, which is stopped below the recording heads 94, by one line of a desired image. Then, the sheet 83 is fed by a predetermined amount and another line is recorded. When the inkjet recording apparatus 2000 receives a signal indicating that a rear end of the sheet 83 has reached a recording area, the inkjet recording apparatus 2000 terminates a recording operation and ejects the sheet 83.

Further, the inkjet recording apparatus 2000 further includes a recovery device 117 to recover the recording heads 94 from a discharge failure. The recovery device 117 is disposed at a position outside the recording area at a right side in the direction of movement of the carriage 93. The recovery device 117 includes a cap unit, a suction unit, and a cleaning unit. In a print standby state, the carriage 93 is moved to the side at which the recovery device 117 is disposed. The recording heads 94 are capped with the cap unit. Accordingly, the nozzles in the recording heads 94 are kept in a wet state, thus preventing discharge failure due to the drying of ink. For example, the inkjet recording apparatus 2000 discharges ink not relating to the recording to maintain the viscosity of ink in all of the nozzles constant, thus maintaining stable discharging performance.

When a discharge failure has occurred, the nozzles of the recording heads 94 are tightly sealed with the cap unit, the suction unit sucks ink and bubbles, for example, from the nozzles via tubes, and the cleaning unit removes ink and dust adhered to the surfaces of the nozzles, thus recovering the discharge failure. The sucked ink is drained to a waste ink container disposed on a lower portion of the apparatus body and is absorbed into and retained in an ink absorber in the waste ink container.

The inkjet recording apparatus 2000 includes the actuator 300 according to the present embodiment. Thus, the actuator 300 has good initial and long-term displacement characteristics, and the head 500 including the actuator 300 has good discharge characteristics. Such a configuration obtains stable discharge properties without discharge failure due to drive failure of the diaphragm, thus enhancing image quality.

EXAMPLES

Hereinafter, the present embodiment is described in detail with reference to Examples illustrated in Tables 1 and 2. However, the present disclosure is not limited to the following Examples.

Example 1

The SOI wafer described in Table 1 was used as a substrate and a diaphragm. Note that a silicon layer in the example is p-type silicon (Si) and the impurity is boron (B).

A Ti film (film thickness of about 20 nm) was formed on the SOI wafer at 350° C. by sputtering, and the TT film and the SOI wafer were thermally oxidized at 750° C. by rapid thermal processing (RTA). Subsequently, a Pt film (film thickness of about 160 nm) was formed at about 300° C. by sputtering. A $TiO_2$ film obtained by thermally oxidizing the Ti film has a role as an adhesion layer between the $SiO_2$ film and the Pt film. Thus, the first electrode was formed on the diaphragm.

Next, as a material of a $PbTiO_3$ layer (also referred to as a PT layer) serving as a seed layer of a PZT film, a coating liquid (referred to as a PT coating liquid) was prepared at a composition ratio of Pb:Ti=1:1.

Further, three liquids of PZT precursor coating liquids were prepared at the following composition ratio as a material of the PZT film.

Pb:Zr:Ti=115:55:45     [1st liquid]

Pb:Zr:Ti=115:49:51     [2nd liquid]

Pb:Zr:Ti=115:43:57     [3rd liquid]

A specific PZT precursor coating liquid was synthesized as follows. First, lead acetate trihydrate, isopropoxide titanium, isopropoxide zirconium was used as a starting material. Crystal water of lead acetate was dissolved in methoxyethanol and was then dehydrated. An amount of lead is excessively large to a stoichiometric composition to prevent a decrease in crystallinity due to so-called lead-out during heat treatment.

Next, isopropoxide titanium and isopropoxide zirconium were dissolved in methoxyethanol. Then, an alcohol exchange reaction and an esterification reaction were performed on the solution of isopropoxide titanium and isopropoxide zirconium. Then, the solution, to which the alcohol exchange reaction and the esterification reaction were performed, was mixed with the methoxyethanol solution in which above-described lead acetate was dissolved, and thus the PZT precursor coating liquid was synthesized. A PZT concentration was 0.5 mol/l. The PT coating liquid is also synthesized in the same manner as the PZT precursor coating liquid.

First, a film was formed by spin coating on a first electrode using a PT coating liquid, and then dried at 120° C. by a hot plate. Thus, a seed layer having a thickness of 7 nm was formed.

Next, a PZT film was formed on the seed layer by spin coating with [1st liquid] having a high Zr ratio. The PZT film was dried at 120° C. and thermally decomposed at 400° C. with a hot plate. Next, a PZT film was formed by [2nd liquid] by spin coating. Then, drying (120° C.) and thermal decomposition (400° C.) were carried out on the PZT film by a hot plate. Further, a PZT film was formed by spin coating with the [3rd liquid] having a low Zr ratio. Then, and drying (120° C.) and thermal decomposition (400° C.) were performed on the PZT film by a hot plate to form three layers. Next, heat treatment (temperature 730° C.) for crystallization of the PZT film was performed by rapid thermal treatment (RTA) after the third layer of thermal decomposition treatment.

The film thickness of the PZT film was 240 nm when the heat treatment of crystallization was completed. The steps of coating (application), drying, thermal decomposition, and crystallization of the PZT precursor liquid were carried out eight times in total (24 layers) to obtain a PZT film having a thickness of about 2.0 µm.

Next, a third electrode and a fourth electrode are formed. A Pt film (film thickness of 125 nm) was formed by sputtering as a metal film (fourth electrode), and a $SrRuO_3$ film (film thickness of 40 nm) was formed as an oxide film (third electrode). Then, a photoresist (TSMR 8800) manufactured by TOKYO OHKA KOGYO CO., LTD. was formed by a spin coat method. After forming a resist pattern by ordinary photolithography, a pattern as illustrated in FIGS. 13A and 13B was manufactured using an ICP etching apparatus (manufactured by Samco Inc.).

Next, an $Al_2O_3$ film having a thickness of 50 nm was formed as the first insulating protective film using the atomic layer deposition (ALD) method. At the time of forming the $Al_2O_3$ film, Al and $O_3$ are alternately laminated to progress a film formation. Aluminum (Al) is generated using tetramethylammonium chloride (TMA, Sigma-Aldrich Co. LLC), and oxygen (O) is generated by an ozone generator. Then, as illustrated in FIGS. 13A and 13B, a contact hole was formed by etching.

Next, Al was deposited by sputtering and patterned by etching as a fifth electrode and a sixth electrode. Then, $Si_3N_4$ was deposited to a thickness of 500 nm as a second insulating protective film by plasma chemical vapor deposition (CVD) to produce an actuator.

Next, the obtained actuator was subjected to polarization process by a corona charging process. The polarization processing apparatus 800 as illustrated in FIG. 14 was used for the polarization process. A tungsten wire having a diameter of 50 µm was used for the corona charging process. The polarization process was carried out at a process temperature of 80° C., a corona charge voltage of 9 kV, a grid voltage of 2.5 kV, a process time of 30 second, a distance between the corona electrode and the grid electrode of 4 mm, and a distance between the grid electrodes and the stage of 4 mm.

Further, a common electrode PAD and an individual electrode PAD for connecting to the fifth electrode and the sixth electrode were formed. The distance between the individual electrodes PAD was set to 80 µm.

Examples 2 to 8 and 10

An actuator was manufactured in the same manner as in Example 1 except that the SOI wafer used in Example 1 was changed to the SOI wafer illustrated in Table 1.

Example 9

An actuator was manufactured in the same manner as in Example 1 except that the SOI wafer used in Example 1 was changed to the SOI wafer illustrated in Table 1, and a $ZrO_2$ film having thickness of 100 nm was formed as the stress control layer on the diaphragm by the ALD method as illustrated in FIG. 5.

Comparative Examples 1 and 2

An actuator was manufactured in the same manner as in Example 1 except that the SOI wafer used in Example 1 was changed to the SOI wafer illustrated in Table 1, and a $TiO_2$ film having thickness of 7 nm was formed by a sputtering apparatus instead of the PT layer serving as the second electrode (seed layer).

Comparative Examples 3 and 4

An actuator was manufactured in the same manner as in Example 1 except that the SOI wafer used in Example 1 was changed to the SOI wafer illustrated in Table 1.

Examples 1 to 10 are referred to "EX1" to "EX10", respectively in Tables 1 and 2. Comparative Examples 1 to 4 are referred to "CE1" to "CE4" in Tables 1 and 2, respectively.

[Evaluation]

Evaluation was performed for the displacement characteristics (piezoelectric constant) and discharge characteristics of the actuator obtained in the above-described examples and the comparative examples.

[Displacement Evaluation]

To evaluate the displacement characteristics of the actuator, an excavation process is performed from a rear surface side of the substrate as illustrated in FIG. 6 to form individual chambers in the substrate, and vibration evaluation is performed on the actuator. An amount of deformation (piezoelectric constant d31) due to electric field application (150 kV/cm) was measured with a laser Doppler vibrometer and calculated from fitting by simulation. The results are illustrated in Table 2. Evaluation standards were as follows. The samples having the evaluation of "Very good" and "Good" were accepted.

[Evaluation Criteria]

Very good: Piezoelectric constant d31 is from −140 pm/V to −160 pm/V. Good: Piezoelectric constant d31 is from −160 pm/V to −180 pm/V (except −160 pm/V). Acceptable: Piezoelectric constant d31 is from −120 to −140 pm/V (except −140 pm/V). Poor: Piezoelectric constant d31 is other than the above range.

The examples 1 to 10 had characteristics (piezoelectric constant −140 pm/V to −180 pm/V) equivalent to a general ceramic sintered body at an initial stage and over time.

The comparative example 1 to 4 had a low piezoelectric constant at least in one of an initial stage and over time, and the characteristics of which are inferior to the characteristics of a general ceramic sintered body.

[Discharge Evaluation]

A liquid discharge head as illustrated in FIG. 7 was manufactured using the actuator obtained as described-above, and the discharge characteristics of the liquid discharge head was evaluated. Using the ink, the viscosity of which was adjusted to 5 cp, as a liquid, the discharge condition was observed while applying an application voltage from −10 V to −30 V by a simple push waveform. Good results are illustrated in an order of "Very good", "Good", "Acceptable", and "Poor" in Table 2.

It was confirmed that all of the liquid discharge heads in Examples 1 to 10 were able to discharge the ink from every nozzles, and the liquid discharge heads were able to discharge ink at high frequency.

Conversely, the Comparative Example 2 could not stably discharge the ink. Further, the Comparative Example 1 could not stably discharge the ink at high frequency.

[Evaluation of Stress on Diaphragm]

The diaphragm of each Examples 1 to 10 had a compressive stress from the measurements of the amount of displacement at the time of manufacturing the diaphragm. On the other hand, the diaphragm of each of the comparative examples had no compressive stress and had tensile stress.

In the above-described embodiment, an example of using p-type Si is described. However, the same result as p-type Si can be obtained even when the silicon layer is made of n-type Si. The diaphragm using n-type Si as a silicon layer can obtain the similar result as the above-described Examples if the diaphragm includes a first silicon oxide film having a thickness of 0.5 μm or more, a silicon layer having a thickness of 3 μm or more on the first silicon oxide film, and a second silicon oxide film having a thickness of 0.5 μm or more on the silicon layer.

Numerous additional modifications and variations are possible in light of the above teachings. Such modifications and variations are not to be regarded as a departure from the scope of the present disclosure and appended claims, and all such modifications are intended to be included within the scope of the present disclosure and appended claims.

TABLE 1

| | SOI | | | | | | |
|---|---|---|---|---|---|---|---|
| | First silicon oxide film [μm] | Silicon layer [μm] | Second silicon oxide film [μm] | Volume resistivity of silicon layer [Ω·cm] | Concentration of impurities of silicon layer (p-type) [atoms/cm$^3$] | Flexural rigidity of diaphragm [Nm$^2$] | Volume resistivity of partition wall of individual chamber [Ω·cm] | Stress control layer |
| EX1 | 0.5 | 3 | 0.5 | $1.0 \times 10^3$ | $1.3 \times 10^{13}$ | $6.4 \times 10^{-10}$ | 10 | NOT EXIST |
| EX2 | 1 | 6 | 1 | $3.0 \times 10^3$ | $4.3 \times 10^{12}$ | $4.5 \times 10^{-9}$ | 10 | NOT EXIST |
| EX3 | 1 | 6 | 1 | $1.0 \times 10^4$ | $1.3 \times 10^{12}$ | $4.5 \times 10^{-9}$ | 10 | NOT EXIST |
| EX4 | 1 | 5 | 2 | $1.0 \times 10^4$ | $1.3 \times 10^{12}$ | $4.6 \times 10^{-9}$ | 5 | NOT EXIST |
| EX5 | 1 | 4 | 2 | $1.0 \times 10^4$ | $1.3 \times 10^{12}$ | $2.9 \times 10^{-9}$ | 5 | NOT EXIST |
| EX6 | 1.5 | 8 | 2.5 | $1.5 \times 10^4$ | $8.6 \times 10^{11}$ | $1.6 \times 10^{-8}$ | 5 | NOT EXIST |
| EX7 | 1 | 5 | 2.5 | $1.2 \times 10^4$ | $1.1 \times 10^{12}$ | $5.3 \times 10^{-9}$ | 1 | NOT EXIST |
| EX8 | 2 | 4 | 4 | $2.0 \times 10^3$ | $6.5 \times 10^{12}$ | $7.0 \times 10^{-9}$ | 1 | NOT EXIST |
| EX9 | 0.5 | 3 | 0.5 | $1.0 \times 10^3$ | $1.3 \times 10^{13}$ | $6.4 \times 10^{-10}$ | 5 | EXIST (ZrO$_2$) |
| EX10 | 0.5 | 3 | 0.5 | $1.0 \times 10^6$ | $1.3 \times 10^{10}$ | $6.4 \times 10^{-10}$ | 10 | NOT EXIST |
| CE1 | 0.2 | 2 | 0.2 | 10 | $1.3 \times 10^{15}$ | $1.7 \times 10^{-10}$ | 100 | NOT EXIST |
| CE2 | 0.2 | 2 | 0.2 | 10 | $1.3 \times 10^{15}$ | $1.7 \times 10^{-10}$ | $1.0 \times 10^5$ | NOT EXIST |
| CE3 | 0.5 | 3 | 0.5 | $2.0 \times 10^6$ | $6.5 \times 10^9$ | $6.4 \times 10^{-10}$ | 10 | NOT EXIST |
| CE4 | 0.5 | 3 | 0.5 | 5 | $2.7 \times 10^{15}$ | $6.4 \times 10^{-10}$ | 10 | NOT EXIST |

TABLE 2

| | PZT | | | DISPLACEMENT EVALUATION (d31) | | DISCHARGE EVALUATION |
|---|---|---|---|---|---|---|
| | Degree of orientation of Peaks | Number of Peaks | Domain Ratio | Initial | Over time | |
| EX1 | 99.5% | Three | 1.022 | −142 Very good | −139 Very good | Good |
| EX2 | 99.6% | Three | 1.024 | −146 Very good | −143 Very good | Very good |
| EX3 | 99.7% | Three | 1.031 | −162 good | −159 Very good | Very good |
| EX4 | 99.5% | Three | 1.036 | −171 good | −168 good | Very good |

TABLE 2-continued

| | PZT | | | DISPLACEMENT EVALUATION (d31) | | DISCHARGE |
| | Degree of orientation | Number of Peaks | Domain Ratio | Initial | Over time | EVALUATION |
|---|---|---|---|---|---|---|
| EX5 | 99.2% | Three | 1.028 | −162 good | −159 Very good | Good |
| EX6 | 99.4% | Three | 1.026 | −161 good | −158 Very good | Very good |
| EX7 | 99.5% | Three | 1.039 | −168 good | −167 good | Very good |
| EX8 | 99.4% | Three | 1.025 | −153 Very good | −152 Very good | Very good |
| EX9 | 99.6% | Three | 1.024 | −151 Very good | −148 Very good | Good |
| EX10 | 99.7% | Three | 1.029 | −153 Very good | −141 Very good | Good |
| CE1 | 95.7% | One | 1.013 | −127 Acceptable | −121 Acceptable | Acceptable |
| CE2 | 95.7% | One | 1.013 | −127 Acceptable | −108 Poor | Poor |
| CE3 | 99.7% | Three | 1.028 | −150 Very good | −129 Acceptable | Acceptable |
| CE4 | 99.7% | Three | 1.012 | −132 Acceptable | −128 Acceptable | Acceptable |

What is claimed is:

1. An actuator comprising:
a diaphragm;
a lower electrode on the diaphragm;
an electromechanical transducer film on the lower electrode; and
an upper electrode on the electromechanical transducer film,
the diaphragm including:
a first silicon oxide film having a thickness of 0.5 μm or more;
a silicon layer on the first silicon oxide film, a thickness of which is 3 μm or more; and
a second silicon oxide film on the silicon layer, a thickness of which is 0.5 μm or more,
a volume resistivity of the silicon layer being $10^3$ Ω·cm or more and $10^6$ Ω·cm or less.

2. The actuator according to claim 1,
wherein the silicon layer is made of p-type silicon, a concentration of impurities of which is $1.3 \times 10^{13}$ atoms/cm$^3$ or less.

3. The actuator according to claim 1,
wherein the silicon layer is made of p-type silicon, a concentration of impurities of which is $1.3 \times 10^{12}$ atoms/cm$^3$ or less and $1.3 \times 10^{10}$ atoms/cm$^3$ or more.

4. The actuator according to claim 1,
wherein the silicon layer is made of n-type silicon, a concentration of impurities of which is $4.3 \times 10^{12}$ atoms/cm$^3$ or less.

5. The actuator according to claim 1,
wherein the silicon layer is made of n-type silicon, a concentration of impurities of which is $4.3 \times 10^{11}$ atoms/cm$^3$ or less and $4.3 \times 10^9$ atoms/cm$^3$ or more.

6. The actuator according to claim 1, wherein the thickness of the second silicon oxide film is equal to or greater than the thickness of the first silicon oxide film.

7. The actuator according to claim 1,
wherein the electromechanical transducer film is made of lead zirconate titanate (PZT),
a degree of orientation of (100) plane obtained by θ-2θ measurement performed on PZT by X-ray diffraction (XRD) is 99% or more, and
a diffraction peak shape of (400) plane is separated into three peaks, and the diffraction peak shape of (400) plane is obtained by varying a tilt angle at an angle of 2θ at which a peak of diffraction intensity of (200) plane or (002) plane is obtained, where the angle of 2θ is formed by a direction of an incident X-ray and a direction of a detector on PZT.

8. The actuator according to claim 1,
wherein the electromechanical transducer film is made of lead zirconate titanate (PZT), and
the PZT has a tetragonal a-domain and c-domain,
wherein a diffraction peak shape of (400) plane is separated into a plurality of peaks and obtained by varying a tilt angle at an angle of 2θ at which a peak of diffraction intensity of (200) plane or (002) plane is obtained, where the angle of 2θ is formed by a direction of an incident X-ray and a direction of a detector on PZT,
lattice constants are determined for peaks of the plurality of peaks corresponding to the tetragonal a-domain and c-domain, and
a ratio of a maximum lattice constant to a minimum lattice constant of the lattice constants is 1.02 or more.

9. The actuator according to claim 1,
wherein a flexural rigidity of the diaphragm is $7.0 \times 10^{-10}$ Nm$^2$ or more.

10. The actuator according to claim 1, further comprising a stress control layer disposed between the diaphragm and the lower electrode.

11. The actuator according to claim 10,
wherein the stress control layer is made of ZrO$_2$.

12. A liquid discharge head comprising:
a nozzle from which a liquid is discharged;
an individual chamber communicating with the nozzle; and
the actuator according to claim 1, the actuator generating pressure in the individual chamber.

13. The liquid discharge head according to claim 12, further comprising a partition wall that partitions the individual chamber in a substrate forming the individual chamber,
wherein the diaphragm is formed on the substrate,
the partition wall is made of silicon, and
a volume resistivity of the partition wall is 10 Ω·cm or less.

14. A liquid discharge device comprising the liquid discharge head according to claim 12.

15. The liquid discharge device according to claim 14, further comprising at least one of:
a head tank to store the liquid to be supplied to the liquid discharge head;
a carriage to mount the liquid discharge head;
a supply unit to supply the liquid to the liquid discharge head;
a maintenance unit to maintain the liquid discharge head; and a drive unit to move the carriage in a main scanning direction, together with the liquid discharge head to form a single unit.

16. A liquid discharge apparatus comprising the liquid discharge device according to claim 14.

* * * * *